(12) United States Patent
Li et al.

(10) Patent No.: US 8,776,895 B2
(45) Date of Patent: Jul. 15, 2014

(54) METHOD FOR QUANTIFYING RESERVOIR CONNECTIVITY USING FLUID TRAVEL TIMES

(75) Inventors: Dachang Li, Katy, TX (US); Xiao-Hui Wu, Sugar Land, TX (US); Tao Sun, Missouri City, TX (US); Frank J Goulding, Houston, TX (US); Robert M Stuart, Abu Dhabi (AE); Timothy A Chartrand, Spring, TX (US); Cory J Ramage, Wichita, KS (US)

(73) Assignee: ExxonMobil Upstream Research Company, Houston, TX (US)

( * ) Notice: Subject to any disclaimer, the term of this patent is extended or adjusted under 35 U.S.C. 154(b) by 1716 days.

(21) Appl. No.: 12/162,480

(22) PCT Filed: Jan. 30, 2007

(86) PCT No.: PCT/US2007/002351
§ 371 (c)(1),
(2), (4) Date: Sep. 28, 2009

(87) PCT Pub. No.: WO2007/106244
PCT Pub. Date: Sep. 20, 2007

(65) Prior Publication Data
US 2010/0057418 A1     Mar. 4, 2010

Related U.S. Application Data

(60) Provisional application No. 60/778,512, filed on Mar. 2, 2006.

(51) Int. Cl.
*E21B 43/00*     (2006.01)

(52) U.S. Cl.
USPC ............................... 166/369; 703/10

(58) Field of Classification Search
USPC ................................ 166/369; 702/13; 703/10
See application file for complete search history.

(56) References Cited

U.S. PATENT DOCUMENTS

| 4,969,130 | A | 11/1990 | Wason et al. |
| 5,757,663 | A | 5/1998 | Lo et al. |

(Continued)

FOREIGN PATENT DOCUMENTS

| EP | 0745870 | 5/1996 |
| EP | 1653411 | 10/2004 |

(Continued)

OTHER PUBLICATIONS

Alabert, F.G. and Modot, V.: "Stochastic Models of Reservoir Heterogeneity: Impact on Connectivity and Average Permeabilities." SPE paper 24893 presented at *The 67th Annual Technical Conference and Exhibition of the Society of Petroleum Engineers* held in Washington, DC, Oct. 4-7, 1992.

(Continued)

*Primary Examiner* — William P Neuder
(74) *Attorney, Agent, or Firm* — ExxonMobil Upstream Research Co. Law Dept.

(57) ABSTRACT

The present application describes a method and system associated with the production of hydrocarbons. In the method, fluid travel time models are constructed from a reservoir model. Then, reservoir connectivity measures are calculated from the fluid travel time models and analyzed to determine a location for at least one well. Based on the analysis, one or more wells may be drilled and hydrocarbons produced.

70 Claims, 18 Drawing Sheets

(56) References Cited

U.S. PATENT DOCUMENTS

| | | | |
|---|---|---|---|
| 5,835,883 | A | 11/1998 | Neff et al. |
| 5,844,799 | A | 12/1998 | Joseph et al. |
| 5,953,680 | A | 9/1999 | Divies et al. |
| 6,018,498 | A | 1/2000 | Neff et al. |
| 6,106,561 | A | 8/2000 | Farmer |
| 6,128,577 | A | 10/2000 | Assa |
| 6,138,076 | A | 10/2000 | Graf et al. |
| 6,374,185 | B1 | 4/2002 | Taner et al. |
| 6,439,854 | B1 | 8/2002 | Skaarup |
| 6,529,833 | B2 | 3/2003 | Fanini et al. |
| 6,597,995 | B1 | 7/2003 | Cornu et al. |
| 6,674,689 | B2 | 1/2004 | Dunn et al. |
| 6,823,266 | B2 | 11/2004 | Czernuszenko et al. |
| 6,826,483 | B1 | 11/2004 | Anderson et al. |
| 6,885,941 | B2 | 4/2005 | Deffenbaugh et al. |
| 7,024,021 | B2 | 4/2006 | Dunn et al. |
| 7,043,367 | B2 | 5/2006 | Granjeon |
| 7,062,383 | B2 | 6/2006 | Deffenbaugh et al. |
| 7,069,149 | B2 | 6/2006 | Goff et al. |
| 7,089,166 | B2 | 8/2006 | Malthe-Sorenssen et al. |
| 7,277,796 | B2 | 10/2007 | Kuchuk et al. |
| 7,363,163 | B2 | 4/2008 | Valec-Dupin et al. |
| 7,369,980 | B2 | 5/2008 | Deffenbaugh et al. |
| 7,424,415 | B2 | 9/2008 | Vassilev |
| 7,433,786 | B2 | 10/2008 | Adams |
| 7,451,066 | B2 | 11/2008 | Edwards et al. |
| 7,467,044 | B2 | 12/2008 | Tran et al. |
| 7,480,205 | B2 | 1/2009 | Wei |
| 7,523,024 | B2 | 4/2009 | Endres et al. |
| 7,542,037 | B2 | 6/2009 | Fremming |
| 7,706,981 | B2 | 4/2010 | Wilkinson et al. |
| 7,711,532 | B2 | 5/2010 | Dulac et al. |
| 7,756,694 | B2 | 7/2010 | Graf et al. |
| 7,784,544 | B2 * | 8/2010 | Lindvig et al. .............. 166/305.1 |
| 7,925,481 | B2 | 4/2011 | Van Wagoner et al. |
| 7,933,750 | B2 | 4/2011 | Morton et al. |
| 7,953,585 | B2 | 5/2011 | Gurpinar et al. |
| 7,986,319 | B2 | 7/2011 | Dommisse |
| 8,145,464 | B2 | 3/2012 | Arengaard et al. |
| 8,280,635 | B2 | 10/2012 | Ella et al. |
| 8,577,660 | B2 | 11/2013 | Wendt et al. |
| 2002/0133323 | A1 | 9/2002 | Dahlberg |
| 2006/0122780 | A1 | 6/2006 | Cohen et al. |
| 2006/0173622 | A1 | 8/2006 | Deffenbaugh et al. |
| 2006/0265131 | A1 | 11/2006 | Deffenbaugh et al. |
| 2007/0027666 | A1 | 2/2007 | Frankel |
| 2007/0203677 | A1 | 8/2007 | Awwiller et al. |
| 2007/0219724 | A1 | 9/2007 | Li et al. |
| 2007/0219725 | A1 | 9/2007 | Sun et al. |
| 2007/0279429 | A1 | 12/2007 | Ganzer et al. |
| 2008/0133550 | A1 | 6/2008 | Orangi et al. |
| 2011/0093864 | A1 | 4/2011 | Wood et al. |
| 2011/0251830 | A1 | 10/2011 | Hilliard et al. |

FOREIGN PATENT DOCUMENTS

| | | |
|---|---|---|
| EP | 1707993 | 3/2005 |
| EP | 1865343 | 6/2007 |
| WF | WO2006/031383 | 3/2006 |
| WO | 96/13788 | 5/1996 |
| WO | 99/28767 | 6/1999 |
| WO | WO 2005/033739 | 4/2005 |
| WO | 2007/022289 | 2/2007 |
| WO | 2007/100703 | 9/2007 |
| WO | 2007/135549 | 11/2007 |

OTHER PUBLICATIONS

Ballin, P.R., Solano, R., Hird, K.B., Volz, R.F.: "New Reservoir Dynamic Connectivity Measurement for Efficient Well Placement Strategy Analysis Under Depletion." SPE paper 77375 presented at *The SPE Annual Technical Conference and Exhibition* held in San Antonio, Texas, Sep. 29-Oct. 2, 2002.

Gajraj, A., Lo, T.S., and Chopra, A.K.: "Connectivity-Constrained Upscaling." SPE paper 38743 presented at the *1997 SPE Annual Technical Conference and Exhibition* held in San Antonio, Texas, Oct. 5-8, 1997.

Hird, K.B. and Durule, O.: "Quantification of Reservoir Connectivity for Reservoir Description Applications." *SPE Reservoir Evaluation & Engineering* (Feb. 1998), pp. 12-17.

Hirsch, L.M. and Schuette, J.F.: "Graph theory applications to continuity and ranking in geologic models." *Computers & Geoscience* (1999)25, pp. 127-139.

Lin, Q.: "Enhancement, Extraction, and Visualization of 3D Volume Data," Ph.D. Dissertation, *Institute of Technology, Linkoping University*, Linkoping, Sweden, Apr. 2003.

Malik, Z.A., Silva, B.A., Brimhall, R.M., and Wu, C.H.: "An Integrated Approach to Characterize Low-Permeability Reservoir Connectivity for Optimal Waterflood Infill Drilling." SPE paper 25853 presented at *The SPE Rocky Mountain Regional/Low Permeability Reservoirs Symposium* held in Denver, CO. U.S.A., Apr. 12-14, 1993.

McKay, M. D., Beckman, R. J., and Conover, W. J.: "A Comparison of Three Methods for Selecting Values of Input Varibles in the Analysis of Output from a Computer Code," *Technometrics* (May 1979), vol. 21, No. 2, pp. 239-245.

Pardalos, P.M., and Resende, M.G.C. (Edited): *Handbook of Applied Optimization*, Chapter 8.3, "Shortest-Path Algorithms, edited by Edith Cohen," Oxford University Press, (2002) pp. 375-385.

Petit, F.M., Biver, P.Y., Calatayud, P.M., Lesueur, J.L., and Alabert, F.G.: "Early Quantification of Hydrocabon in Place Through Geostatistic Object Modelling and Connectivity Computations." SPE paper 28416 presented at *The SPE 69th Annual Technical Conference and Exhibition* held in New Orleans, LA, U.S.A., Sep. 25-28, 1994.

Richardsen, S.K., and Randen, T. "Mapping 3D Geo-Bodies Based on Level Set and Marching Methods." *Mathematical Methods and Modeling in Hydrocarbon Exploration and Production*, edited by Iske, A. and Randen, T., Springer-Verlag, Berlin 2005.

Sethian, J.A.: "Fast Marching Methods," SIAM Review (1999), vol. 41, No. 2, pp. 199-235.

Wiggins, M. et al., "Development of Reservoir Characterization Techniques & Production Models for Exploiting Naturally Fractured Reservoirs," DOE (US Dept. of Energy) Technical Report, Univ. of Oklahoma, Pub. Date (Dec. 2002). Retrieved from the internet <URL: http://www.osti.gov/bridges/servlets/purl/820941-7V2mo/native/820941.pdf>.

International Search Report (Feb. 2008) for PCT Application No. PCT/US2007/002351 Filed Jan. 30, 2007.

P. Vrolijk, et al., Reservoir Connectivity Analysis—Defining Reservoir Connections and Plumbing, Mar. 12-15, 2005, SPE 93577, pp. 1-23.

EP Search Report, dated Jun. 16, 2011, EP No. 07717104.9-2315.

Wu, J., et al., (2008), "Fast FILTERSIM Simulation With Score-Based Distance", *Math Geosci*, v40, pp. 773-788.

Yao, T., (1998), "Conditional Spectral Simulation With Phase Identification", *Mathematical Geology*, v30, No. 3, pp. 285-308.

Ypma, T.J., (1995), "Historical Development of the Newton-Raphson Method", *SIAM Review*, v37, No. 4, pp. 531-551.

Zhang, T., et al., (2006), "Filter-Based Classification of Training Image Patterns for Spatial Simulation", *Mathematical Geology*, v38, No. 1, pp. 63-80.

\* cited by examiner

METHOD FOR QUANTIFYING RESERVOIR CONNECTIVITY USING FLUID TRAVEL TIMES

RELATED APPLICATIONS

This application is the National Stage entry under 35 U.S.C. 371 of PCT/US2007/002351 that published as WO 2007/106244 and was filed on Jan. 30, 2007 claims the benefit of U.S. Provisional Application 60/778,512, filed 2 Mar. 2006.

FIELD OF THE INVENTION

This invention relates generally to a system and method for petroleum reservoir characterization and geologic/reservoir modeling. More particularly, the invention relates to a method for measuring and characterizing reservoir connectivity in geologic/reservoir models for sedimentary process simulation, geologic modeling, and reservoir fluid flow simulation for the use in producing hydrocarbons.

BACKGROUND

This section is intended to introduce various aspects of the art, which may be associated with exemplary embodiments of the present techniques. This discussion is believed to assist in providing a framework to facilitate a better understanding of particular aspects of the present techniques. Accordingly, it should be understood that this section should be read in this light, and not necessarily as admissions of prior art.

The production of hydrocarbons, such as oil and gas, has been performed for numerous years. To produce these hydrocarbons, geophysical data about specific areas is obtained to provide a model of subsurface reservoirs via computer systems, such as simulators. As can be appreciated, the technology utilized to obtain this geophysical data has been applied for onshore mineral exploration, oceanic tectonic studies, and offshore petroleum and mineral resource exploration. Based on the models, a wellbore may be drilled to the subsurface reservoir and devices may be placed into the wellbore to access the formation fluids. These formation fluids may flow through the wellbore to surface facilities for further processing.

Reservoir connectivity, which is a measure of the ability of fluid to communicate between any points or regions within a reservoir, is one of the primary factors that controls hydrocarbon production efficiency and ultimate recovery. Despite efforts by geoscientists and engineers, measuring and quantifying connectivity in geologic or reservoir models is still a challenge in reservoir characterization and modeling. There are generally at least five components utilized to measure reservoir connectivity. First, reservoir connectivity should be measured not only between two points (local), but also for the entire geologic/reservoir model (global). Second, reservoir connectivity measures should reflect "effective connectivity" resulting from different reservoir recovery processes. Third, reservoir connectivity measures should be scale/grid-independent. Fourth, reservoir connectivity measures calculations should be computationally efficient. Fifth, the method to estimate reservoir connectivity measures should result in minimum errors.

Typically, current technologies in reservoir connectivity measures in geologic/reservoir models may be divided into two groups, which are flow simulation based and flow property based. Flow simulation based approaches use a full flow simulator that solves the complex physical differential equations to simulate reservoir performance and its performance responses (e.g., velocity, productivity, and sweep efficiency). See Malik, Z. A. et al., "An Integrated Approach to Characterize Low-Permeability Reservoir Connectivity for Optimal Waterflood Infill Drilling," SPE 25853 (1993); and Gajraj, A. et al., "Connectivity-Constrained Upscaling," SPE 38743 (1997). Reservoir connectivity may be estimated and evaluated using the full flow simulation results. However, because this approach is computationally intensive, only small models (a model with less than one million cells) may be reasonably analyzed for a few points in the reservoir model rather than the entire reservoir model. As such, the flow simulation based approach is too computationally expensive for reservoir connectivity studies when a geologic model is composed of ten million cells or more, which is common in reservoir characterization and modeling applications.

The flow property based approach may also include different methods to perform a connectivity calculation. For instance, the flow property based approach may include the potential propagation method, the resistivity index method, the least resistance method, and the fast marching method. The potential propagation method uses a "wave front" driven by "potential" (i.e. the breadth-first search (BFS) method) to search the shortest distance between two given points. See Alabert, F. G. et al., "Stochastic Models of Reservoir Heterogeneity: Impact on Connectivity and Average Permeabilities," SPE 24893 (1992); and Petit, F. M. et al., "Early Quantification of Hydrocarbon in Place Through Geostatistic Object Modelling and Connectivity Computations," SPE 28416 (1994). In this method, flow properties (e.g. horizontal and vertical permeabilities) are used as thresholds to turn a geologic/reservoir model into binary codes (e.g. 1 for flow and 0 for no flow), and reservoir connectivity is analyzed using these binary codes. However, the use of the thresholds only introduces possible errors because the heterogeneity of the flow properties is not taken into account. In addition, the shortest distance search method introduces large orientation errors (i.e. up to about 29.3%), which are the result of the geometry of the cells or grid blocks utilized in the model. As such, the potential propagation method is not accurate because it does not account for reservoir heterogeneity and creates large orientation errors in the shortest distance search.

The resistivity index method uses a resistivity index to replace the binary codes in the potential propagation method. See Ballin, P. R. et al., "New Reservoir Dynamic Connectivity Measurement for Efficient Well Placement Strategy Analysis Under Depletion," SPE 77375 (2002); and Hird, K. B. et al., "Quantification of Reservoir Connectivity for Reservoir Description Applications," SPE Reservoir Evaluation & Engineering pp. 12-17 (February 1998). The use of fluid flow properties (e.g. transmissibility) in the resistivity index method improves the potential propagation method over methods that utilize the thresholds. However, this method is grid/scale-dependent because it uses transmissibility as a search weight (or cost function). The grid/scale-dependence makes comparing models with different grids/scales impossible or difficult because the different grids/scales are not comparable. Further, this method still has the orientation errors in the shortest distance search, which are similar to the potential propagation method.

The least resistance method is similar to the resistivity index method except that the least resistance method uses a different mechanism, such as the graph theory, to determine the shortest path. See Hirsch, L. M. et al., "Graph theory applications to continuity and ranking in geologic models," Computers & Geoscience 25, pp. 127-139 (1999); and International Patent Application No. PCT/US04/32942. This method, which is similar to the resistivity index method, is grid/scale-dependent, which makes comparing models with different grids/scales difficult. Further, while the use of unstructured grids may reduce the errors to 13.4%, these orientation errors are still present in this method.

Finally, the fast marching method enhances the previous methods by reducing the orientation errors from more than 10% in the resistivity index method and the least resistance method to less than 1%. See Richardsen, S. K. et al., "Mapping 3D Geo-Bodies Based on Level Set and Marching Methods," Mathematical Methods and Modeling in Hydrocarbon Exploration and Production, edited by Iske, A. and Randen, T., Springer-Verlag, Berlin pp. 247-265 (2005); and Sethian, J. A., "Fast Marching Methods," SIAM REVIEW, Vol. 41, No. 2, pp. 199-235 (1999); and International Patent Application Publication No. WO2006/127151. Similar to the other existing methods, the fast marching method is developed to quantify reservoir connectivity between two points or from one given point to any other points rather than addressing the global connectivity for the entire geologic/reservoir model. In particular, this method has been used primarily in seismic-based connectivity modeling. As such, the fast marching method is a local method that is difficult to use for anisotropic problems and utilizes a velocity field that is assumed because it is generally not available.

While these typical methods may be utilized, these methods fail to address each of the components mentioned above. As such, the need exists for a method of measuring reservoir connectivity that addresses these requirements.

Other related material may be found in at least U.S. Pat. No. 6,823,266 and U.S. Patent Publication No. 20040236511. Further, related information may be found at least in Lin, Q., "Enhancement, Extraction, and Visualization of 3D Volume Data," Ph. D. Dissertation, Institute of Technology, Linkoping University, Linkoping, Sweden, (April 2003); McKay, M. D. et al., "A Comparison of Three Methods for Selecting Values of Input Variables in the Analysis of Output from a Computer Code," Technometrics, Vol. 21, No. 2, pp. 239-245, (May 1979); and Pardalos, P. M. and Resende, M. G. C. (Edited), Handbook of Applied Optimization, Oxford University Press pp. 375-385 (2002).

SUMMARY

In one embodiment, a method for producing hydrocarbons is described. The method includes constructing fluid travel time models from a reservoir model; calculating reservoir connectivity measures from the fluid travel time models; analyzing the reservoir connectivity measures to determine a location for at least one well; drilling the at least one well based on the analysis; and producing hydrocarbons from the drilled at least one well.

In a second embodiment, a method for evaluating a reservoir model is described. The method includes obtaining a model of a reservoir; nondimensionalizing the reservoir model; constructing a plurality of fluid travel time models from the nondimensionalized reservoir model; calculating reservoir connectivity measures from the plurality of fluid travel time models; and analyzing the reservoir connectivity measures to determine the location of at least one well for a reservoir.

In a third embodiment, a system associated with the production of hydrocarbons is described. The system includes a processor; memory coupled to the processor; an application stored in the memory; and a monitor. The application is configured to construct a plurality of fluid travel time models from a reservoir model and calculate reservoir connectivity measures from the plurality of fluid travel time models. The monitor is coupled to the processor and configured to present the reservoir connectivity measures.

BRIEF DESCRIPTION OF THE DRAWINGS

The foregoing and other advantages of the present technique may become apparent upon reading the following detailed description and upon reference to the drawings in which.

DETAILED DESCRIPTION

In the following detailed description section, the specific embodiments of the present techniques are described in connection with preferred embodiments. However, to the extent that the following description is specific to a particular embodiment or a particular use of the present techniques, this is intended to be for exemplary purposes only and simply provides a description of the exemplary embodiments. Accordingly, the invention is not limited to the specific embodiments described below, but rather, it includes all alternatives, modifications, and equivalents falling within the true spirit and scope of the appended claims.

The present technique describes a method, which may be referred to as the "Fluid Travel Time Method" (FTTM), which is more computationally efficient than the methods described above. This method measures and quantifies "effective" reservoir connectivity based on different reservoir recovery mechanisms (e.g., primary depletion, secondary and tertiary recoveries) for the entire geologic/reservoir model. This method not only introduces reliable reservoir connectivity measures for sedimentary process simulation, reservoir characterization, and geologic/reservoir modeling, but also may provide connectivity maps and quantitative charts for the optimization of reservoir depletion and recovery plans. Thus, the method of the present techniques may be utilized to enhance the measuring and characterizing connectivity in geologic/reservoir models, geologic modeling, and reservoir fluid flow simulation for the use in producing hydrocarbons.

Figure 1:
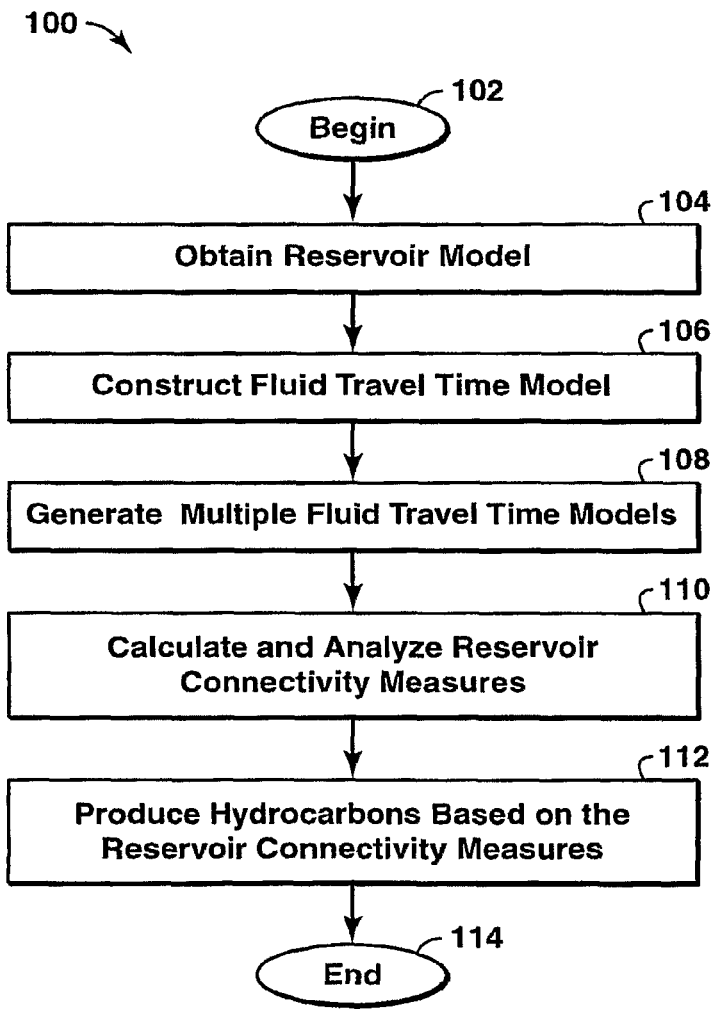
FIG. 1 is an exemplary flow chart for measuring and characterizing reservoir connectivity in accordance with aspects of the present techniques.

Turning now to the drawings, and referring initially to FIG. 1, an exemplary flow chart of the modeling connectivity in accordance with aspects of the present techniques. In this flow chart, which is referred to by reference numeral 100, fluid travel times are utilized to measure reservoir connectivity. The generation or construction of multiple fluid travel time models enhances the reservoir connectivity measures that are utilized to explore for well locations. Further, it should be noted that the calculation and analysis of the reservoir connectivity in this method is performed in multiple dimensions to further clarify the reservoirs performance. As such, the flow chart 100 provides a process that may be utilized to quantify reservoir connectivity not only locally, but also globally. In addition, the process characterizes "effective connectivity" for different recovery processes, which is scale/grid independent, computationally efficient, and more accurate.

The flow chart begins at block 102. At block 104, a reservoir or geologic model is obtained. The geologic or reservoir model is a digital or numerical representation of a petroleum reservoir using a discretized grid with properties in each grid cell, which are discussed further below. From the reservoir model, a fluid travel time model is constructed, as shown in block 106. The construction of the fluid travel time model may involve converting a reservoir model into a base model, such as a flow network model or node model to create a fluid travel time model. The construction process can be done by using graph theory method and front propagation method with or without fluid flow simulation. For example, the simulation is used to calculate the flow velocity distribution for the graph theory and front propagation methods. If simulation is too computationally expensive, the two methods can calculate velocity approximately without using simulation results. With the graph theory method, a flow network model is composed of nodes and connections to represent the reservoir model. A fluid (e.g. oil, gas and/or water) travels from one node to another through connections. A single source, shortest path algorithm is applied to build a fluid travel time model based on the flow network model. The fluid travel time model includes fluid travel times from a given point or a set of points (e.g. a well) to any other node in the model. Alternatively, with the front propagation method, a node model that includes nodes representing the reservoir model is utilized. However, unlike the graph theory method, nodes in the front propagation method are connected with a continuous medium rather than a finite number of connection lines. Once the node model is built, the fast marching method is used to build a fluid travel time model from the node model. As such, various methods may be utilized to construct the base model that is utilized to create the fluid travel time model.

Once the fluid travel time model is constructed, multiple fluid travel time models for various reservoir connectivity measures may be generated, as shown in block 108. Each of the fluid travel time models is created by randomly placing a well (or a set of points) in the base model. A large number of wells are sampled to capture the reservoir connectivity statistics for the entire model. This provides reservoir connectivity analysis with multiple fluid travel time models. Then, the reservoir connectivity is calculated and analyzed using the fluid travel time models, as shown in block 110. The reservoir connectivity measures may be directly related to reservoir recovery processes, which may enhance the analysis by making it very efficient. For instance, the reservoir connectivity measures may include, but not limited to, producible pore volume (PPV), producible time volume aspect ratio (PVAR), interconnected pore volume plateau length ($L_p$), interconnected pore volume decline coefficient (IPVDC), interwell breakthrough velocity (IBV), interwell connected volume aspect ratio (ICVAR), and interwell connected volume orientation ($\alpha$).

Then, in block 112, the reservoir connectivity measures may be utilized in the production of hydrocarbons from the reservoir. The production of hydrocarbons may include drilling wells in specific locations based on the reservoir connectivity measures, installing well tools within specific portions of one or more wells based on the reservoir connectivity measures, and operating the one or more wells to produce hydrocarbons based on the reservoir connectivity measures. Accordingly, the flow chart ends at block 114.

Beneficially, the present techniques may be utilized to enhance well location optimization, reservoir model validation, risk-uncertainty analysis, and/or reservoir depletion plans. Because wells provide access to hydrocarbons located in deep reservoirs, well locations may be selected to reduce cost and enhance the production from the reservoirs. For instance, well location optimization may create the values in a range from million to billion dollars. Reservoir modeling, risk-uncertainty analysis, and reservoir depletion plans are the critical components of the investment decisions in the hydrocarbon production business.

Figure 2:
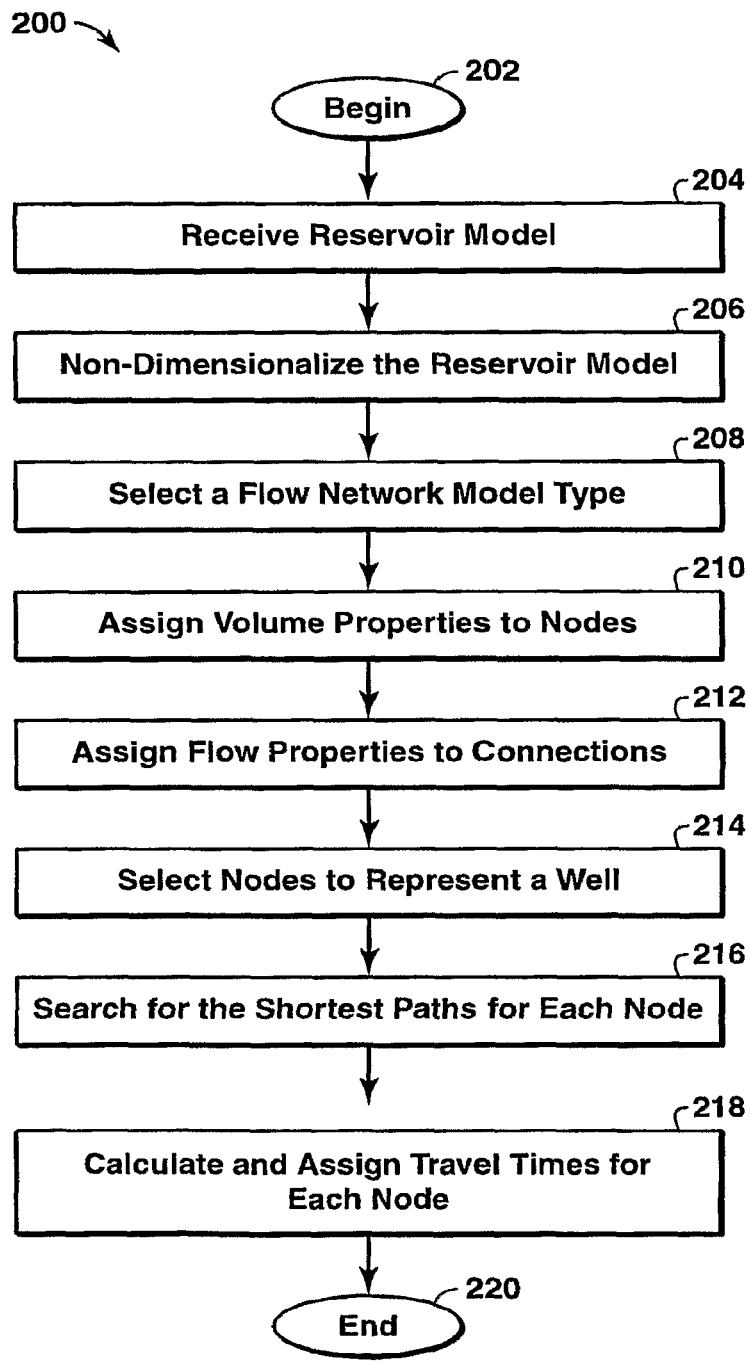
FIG. 2 is an exemplary flow chart for constructing the fluid travel time model in the flow chart of FIG. 1 based on a graph theory method in accordance with certain aspects of the present techniques.
Figure 3A:
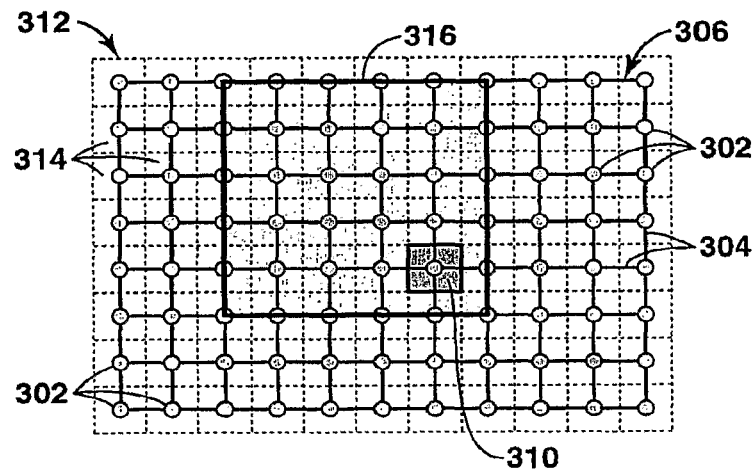
FIGS. 3A-3B are exemplary embodiments of the construction of a flow network model in the flow chart of FIG. 2.
Figure 3B:
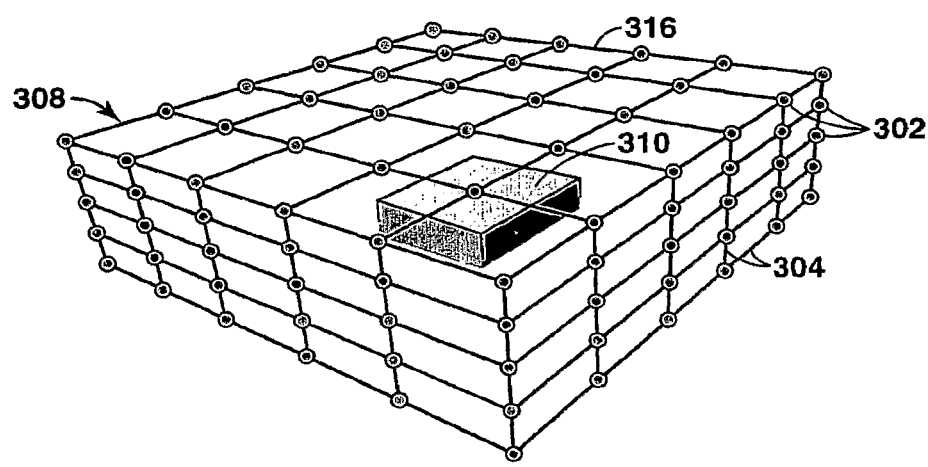

FIG. 2 is an exemplary flow chart for constructing the fluid travel time model in FIG. 1 based on graph theory method in accordance with aspects of the present techniques. In this flow chart, which is referred to by reference numeral 200, the graph theory method is utilized to receive a reservoir model, build a flow network model from the reservoir model, and construct a fluid travel time model from the flow network model. Beneficially, with this process, various types of grids may be input and non-dimensionalized to provide the connectivity quantification with the measurements that are independent of scales.

The flow chart begins at block 202. In blocks 204 and 206, the reservoir model is received and non-dimensionalized. At block 204, a reservoir or geologic model is obtained. The reservoir model may include different types of grids, such as structured corner point grids and unstructured grids. Because the reservoir model is a digital (numerical) representation of a petroleum reservoir using a discretized grid with properties in each grid cell, the grids may be structured (e.g., rectangles or quadrilaterals) or unstructured (e.g., triangles, quadrilaterals, pentagons, hexagons, etc.) and the properties in the grid cells may include rock fluid type and associated volume and flow properties. By utilizing the present techniques, there is no restriction on grids in the reservoir model that is utilized to build the fluid travel time model. That is, the present techniques may utilize different types of grids for reservoir connectivity analysis because it is performed in a manner that is independent of the type of grid. Then, at block 206, the received reservoir model may be non-dimensionalized. The non-dimensionalization of the reservoir model may be utilized when reservoir models to be analyzed have different scales. The non-dimensionalization is performed by dividing each coordinate by a characteristic length (e.g., the maximum model length in the x, y, and z directions) of the reservoir model. By utilizing this process, the comparison of different scales of reservoir models may provide grid independence and compare results in an accurate manner.

Then, the flow network model may be built in blocks 208-212. At block 208, an areal flow network type is selected. The areal flow network types may include three, four, six, and eight connected neighbors. Because a flow network is composed of nodes and connections, which are described below in greater detail FIGS. 3A-3B, 4A-4H, 5A-5B and 6A-6C, volume properties are assigned to the nodes, as shown in block 210. The volume properties may include total volume, pore volume, hydrocarbon pore volume and any combination thereof. Further, the flow properties are assigned to the connections between nodes in block 212. The flow properties may include permeability, porosity, fluid density, fluid viscosity, fluid travel time and any combination thereof. With the properties assigned, the flow network model is constructed.

From the flow network model, a fluid travel time model may be constructed in blocks 214-218. At block 214, a well is selected as a source. It should be noted that a fluid travel time model is defined as the flow network model that contains fluid travel times from a given well to each of the nodes in the flow network model. The well may be defined by a set of nodes through which the well passes, which is described further in FIGS. 6A-6C. In this manner, different nodes are interconnected and treated as a single source. The well may include vertical sections with partial or full penetration into the fluid flow model, or may include sections having deviated or horizontal sections of variable lengths. After the well is defined, the shortest paths from each node to the well may be constructed based on the well, as shown in block 216. The shortest path may be determined by calculating the single source shortest paths (SSSP) based on network optimization or graph theory, which is discussed further below. Then, at block 218, fluid travel times may be calculated and assigned for each of the nodes. The calculation and assignment of fluid travel times may include computing the travel time along the shortest path from the given well to a given node and associating the travel time with the node. Accordingly, the process ends at block 220.

To further describe the flow chart 200 of FIG. 2, various embodiments of flow network models are described in FIGS. 3A-3B, 4A-4H and 5A-5B. In particular, FIG. 3 is an exemplary embodiment of flow network models utilized in the flow chart of FIG. 2. As noted above, a flow network model is composed of nodes 302 and connections 304, which are shown in a 2 dimensional (2D) flow network model 306 and a 3 dimensional (3D) flow network model 308. In these models 306 and 308, each of the nodes 302 is a point (e.g. the center point) within a model cell and stores volume properties (e.g., total volume, pore volume, and hydrocarbon pore volume) of the control volume 310 of the respective node. The control volume 310 for a node is defined as the cell within a reservoir model that contains the node 302. The relationship of a defined space 316 is shown in the different models 306 and 308. The nodes 302 are linked by connections 304, which each stores the flow properties (e.g., permeability, porosity, fluid density, fluid viscosity, and fluid travel time) between the two nodes 302 of the respective connection 304.

To form the flow network models 306 and 308, a geologic or reservoir model grid 312 (dashed line) is utilized. To begin, the geometric center of each of the grid cells 314, which is a circle in model 306 or sphere in model 308, is converted into a node 302 of the flow network model 306 or 308. Then, a node 302 is coupled together with its neighbors with the respective connections 304. It should be noted that the node 302 does not have to be located in the geometric center of each cell, but may be located at different locations within the each cell in other embodiments.

Figure 4A:
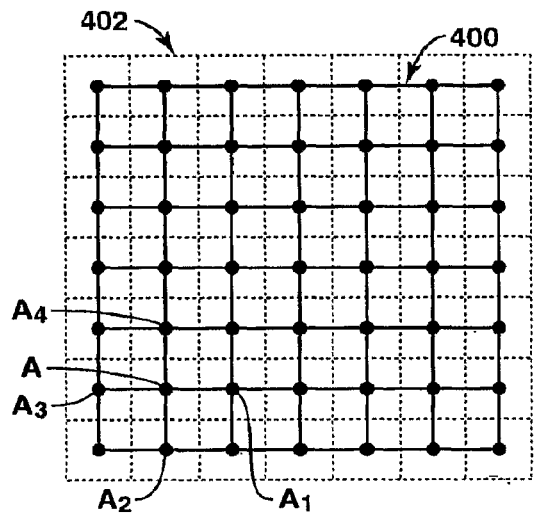
FIGS. 4A-4H are exemplary embodiments of different types of areal flow networks utilized by the flow chart of FIG. 2 in accordance with certain aspects of the present techniques.
Figure 4B:
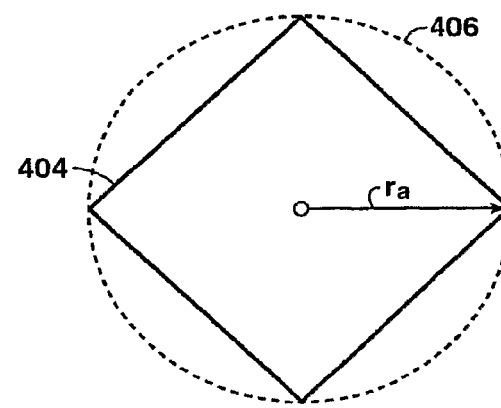

To construct the 3D flow network model 308, an appropriate areal flow network is selected. Several types of areal flow networks may be selected based on the number of connected neighbors are utilized for each of the nodes 302. Each of these different types of areal flow networks are discussed below in FIGS. 4A-4H. For instance, FIG. 4A is an exemplary embodiment of a four-neighbor flow network or four-neighbor flow network model 400, while FIG. 4B is a graph of the drainage (or injection) profile for the four-neighbor flow network model 400. In FIGS. 4A-4B, a structured grid 402 with cells, which may be square or rectangle shaped cells, is shown. From this structured grid 402, the four-neighbor flow network having four connected neighbors for each node may be constructed. For instance, each node, such as node A, may be connected to four other nodes, such as neighbor nodes $A_1, A_2, A_3$, and $A_4$. Thus, each of the nodes in the four-neighbor flow network 400 is connected to a maximum of four neighbor nodes.

However, with the four-neighbor flow network 400, large orientation errors in the flow paths may be present. For instance, as shown in FIG. 4B, fluid flow is determined by the network geometry. For a homogeneous reservoir, the calculated drainage (or injection) front with a well positioned at the geometric center of the drainage (or injection) area or node for the four-neighbor flow network 400 has a diamond shape 404 rather than a circular shape 406. The circular shape with a radius $r_a$ is an accurate representation of the drainage (or injection) from the homogeneous reservoir. As a result, the maximum error (i.e. the deviation from between the diamond shape 404 and the circular shape 406) for this type of flow network model is about 29.3%, while the average error is about 20.5%.

Figure 4C:
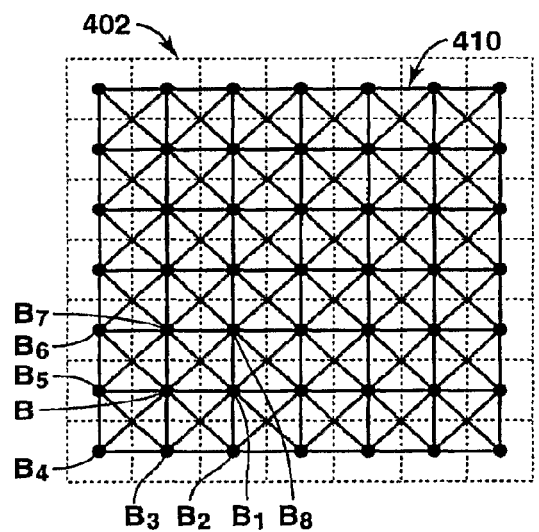
Figure 4D:
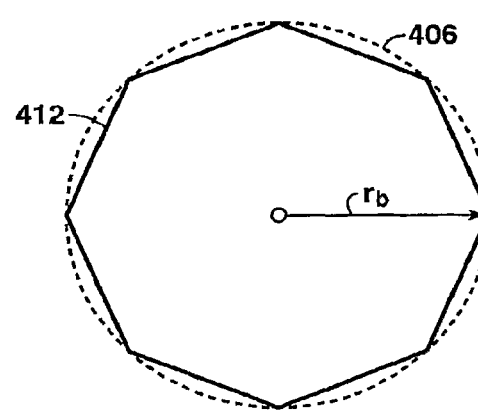

As an alternative embodiment, a flow network model may include eight connected neighbor nodes, as shown in FIGS. 4C and 4D. FIG. 4C is an exemplary embodiment of a eight-neighbor flow network or eight-neighbor flow network model 410, while FIG. 4D is a graph of the drainage (or injection) profiles in the eight-neighbor flow network. Typically, the eight-neighbor flow network 410 is used in reservoir flow simulation, rather than in network modeling for connectivity analysis, to reduce the grid orientation errors. In FIGS. 4C-4D, the structured grid 402 is again utilized to construct the eight-neighbor flow network 410 having a maximum of eight connected neighbor nodes for each of the nodes. For instance, each node, such as node B, may be connected to eight other nodes, such as neighbor nodes $B_1, B_2, B_3, B_4, B_5, B_6, B_7$ and $B_8$. Accordingly, the calculated drainage (or injection) front for a well positioned at the geometric center of the drainage (or injection) area or node for the eight-neighbor flow network 410 has an octagon shape 412 rather than a circular shape 406. Because the octagon shape 412 more closely resembles the circular shape 406, the maximum error (i.e. the deviation from between the octagon shape 412 and the circular shape 406) for this type of flow network model is about 7.6%, while the average error is about 5.1%. As a result, this type of flow network model may be beneficial for reservoir models constructed using structured quadrilateral grids.

Figure 4E:
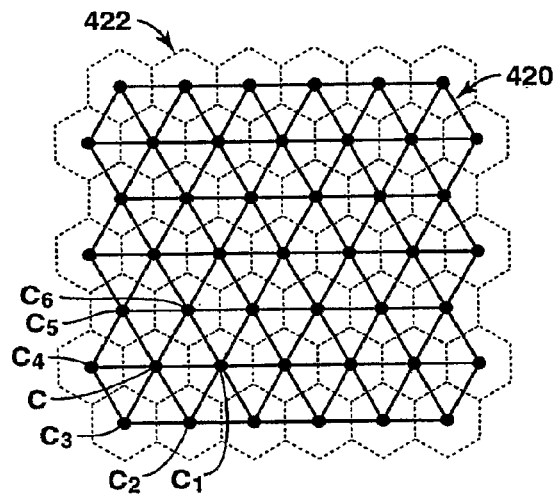
Figure 4F:
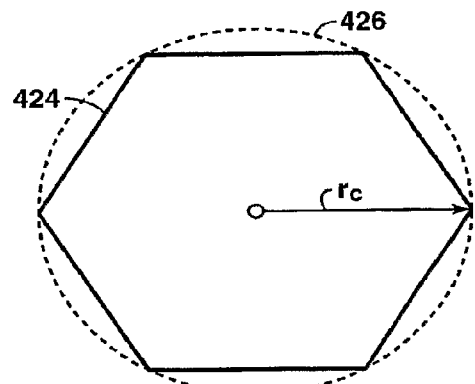

As another alternative embodiment, a flow network model may include a variable number of neighbor nodes when the reservoir model is built using unstructured grids, as shown in FIGS. 4E-4H. Unstructured grids for reservoir models may include various shapes, such as triangles, quadrilaterals, pentagons, and hexagons, which may have 3, 4, 5 and 6 neighbor nodes, respectively. For instance, FIG. 4E is an exemplary embodiment of a six-neighbor flow network or six-neighbor flow network model 420 having six neighbor nodes, while FIG. 4F is a graph of the drainage profiles in the six-neighbor flow network 420. Typically, the six-neighbor flow network 420 is used in reservoir flow simulation, rather than in network modeling for connectivity analysis, to reduce the grid orientation errors. In FIGS. 4E-4F, the hexagon grid 422 is utilized to construct the six-neighbor flow network 420 having a maximum of six connected neighbor nodes for each of the nodes. For instance, each node, such as node C, may be connected to six other nodes, such as neighbor nodes $C_1$, $C_2$, $C_3$, $C_4$, $C_5$ and $C_6$. Accordingly, the calculated drainage (or injection) front for a well positioned at the geometric center of the drainage (or injection) area or node for the six-neighbor flow network 420 has a hexagon shape 424 rather than a circular shape 426 having a radius of $r_c$. The maximum error (i.e. the deviation from between the hexagon shape 424 and the circular shape 426) for this type of flow network model is about 13.4%, while the average error is about 9.1%. As a result, this type of flow network model is less accurate than the eight-neighbor flow network 410, but is more accurate than the four-neighbor flow network 400.

Figure 4G:
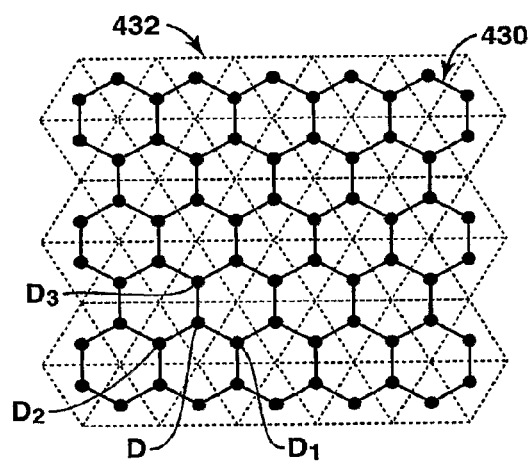
Figure 4H:
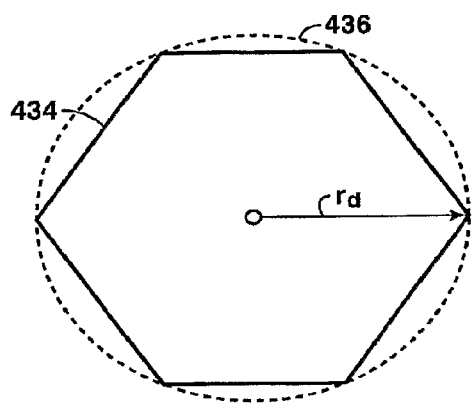

As another alternative for the unstructured grids for reservoir models, FIG. 4G is an exemplary embodiment of a three-neighbor flow network or three-neighbor flow network model 430 having three neighbor nodes, while FIG. 4H is a graph of the drainage (or injection) profiles in the three-neighbor flow network 430. In FIG. 4G, the triangular grid 432 is utilized to construct the three-neighbor flow network 430 having a maximum of three connected neighbor nodes for each of the nodes. For instance, each node, such as node D, may be connected to three other nodes, such as neighbor nodes $D_1$, $D_2$ and $D_3$. Accordingly, the calculated drainage (or injection) front for a well positioned at the geometric center of the drainage (or injection) area or node for the three-neighbor flow network 430 has an irregular hexagon shape 434 rather than a circular shape 436 having a radius of $r_d$. The maximum error (i.e. the deviation from between the irregular hexagon shape 434 and the circular shape 436) for this type of flow network model is about 18.1%, while the average error is about 9.8%. As a result, this type of flow network model is less accurate than the eight-neighbor flow network 410, but is more accurate than the four-neighbor flow network 400.

Beneficially, these different flow network models provide flexibility for the computation speed and accuracy. For example, in Table 1 below:

TABLE 1

| Number of Neighbors | Grid Type Structure | % of Computational Enhancement | % of Average Errors |
|---|---|---|---|
| 8 | Structured | 0% | 5.1% |
| 6 | Unstructured | 20% | 9.1% |
| 4 | Structured | 40% | 20.5% |
| 3 | Unstructured | 50% | 9.8% |

Typically, the larger the number of neighbor nodes, the more accurate, and the computationally more expensive (i.e. slower) the modeling operations. However, the three-neighbor model is both more accurate and more efficient than the four-neighbor model. Generally, for structured grid types, if the errors are too large for the four-neighbor model, then the eight-neighbor model may be utilized to provide more accurate data if it is computationally acceptable for an application. The computational enhancement in Table 1 is based on the computational cost of searching around the neighbor nodes. However, the actual computational enhancement is much lower for the entire connectivity calculation. Similarly, for unstructured grid types, if the errors are too large for the three-neighbor model, then the six-neighbor model may be utilized to provide more accurate data, but the accuracy improvement is small in comparison to the loss in the computational efficiency. Accordingly, from this table, the eight-neighbor model may be preferred for the structured grid type, while the three-neighbor model may be preferred for the unstructured grid type.

For instance, for the reservoir models with unstructured grids, the flow network based on quadrilateral grids gives the highest errors (max 29.3% and average 20.5%), while the flow network based on hexagon grids results in the lowest errors (max 13.4% and average 9.1%). As such, the errors generated in the flow networks based on pentagon and triangle grids are between those of quadrilateral and hexagon grids. However, the three-neighbor flow network may be superior to the six-neighbor flow network in terms of computation speed and accuracy because it is faster with about the same accuracy. To minimize errors, the eight-neighbor flow network may be preferred for reservoir models with structured grids and the three-neighbor flow network for the reservoir models with unstructured grids.

Figure 5A:
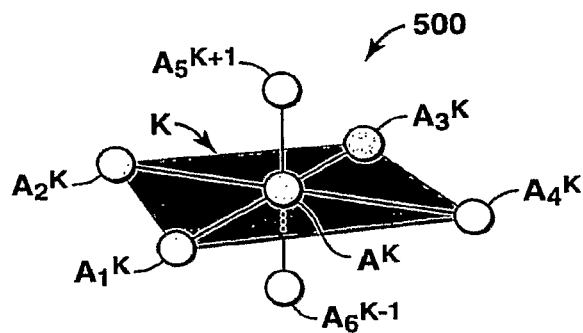
FIGS. 5A-5B are partial views of connections for a single node in exemplary flow network models utilized in the flow chart of FIG. 2 in accordance with certain aspects of the present techniques.
Figure 5B:
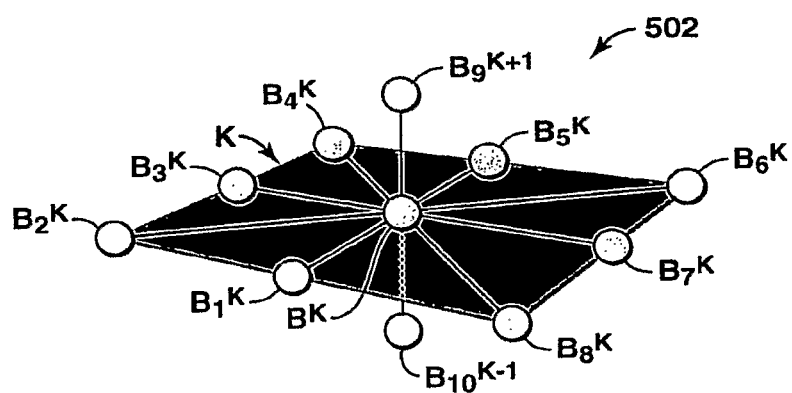

Once an appropriate flow network model, such as one of the flow network models from FIGS. 4A-4H, has been selected, the 3D flow network may be constructed. In 3D flow network models, a node in layer K of a flow network may be connected to an upper neighbor node in the upper layer (K+1) and the lower neighbor node in the lower layer (K−1). The number of neighbor nodes for a 3D flow network is equal to two plus the number of neighbors for the flow network model, as discussed below in FIGS. 5A-5B. For example, FIG. 5A is a partial view 500 of the connections for a single node A in a 3D four-neighbor flow network, while FIG. 5B is a partial view 502 of the connections for a single node in a 3D eight-neighbor flow network. In the partial view 500 of the 3D four-neighbor flow network, a node AK in the layer K may be connected to neighbor nodes $A_1^K$, $A_2^K$, $A_3^K$ and $A_4^K$ in layer K, an upper node $A_5^{K+1}$ in a layer K+1 above the layer K, and a node $A_6^{K-1}$ in a layer K−1 below the layer K, which is the lower neighbor node in the lower layer (K−1). In the partial view 502 of the 3D eight-neighbor flow network, a node $B^K$ in the layer K may be connected to neighbor nodes $B_1^K$, $B_2^K$, $B_3^K$, $B_4^K$, $B_5^K$, $B_6^K$, $B_7^K$, and $B_8^K$ in layer K, an upper node $B_9^{K+1}$ in a layer K+1 above the layer K, and a node $B_{10}^{K-1}$ in a layer K−1 below the layer K. Thus, each node in the flow networks may be connected to two additional nodes from layers above or below the node layer.

In these connections, each node is generally coupled to only one node in an upper or lower layer because the lateral length of a reservoir model is ten times or more larger than the vertical thickness. That is, the errors introduced by using only one node in each of the upper and lower layers are relatively small compared to the errors associated with the areal drainage (or injection) profiles. Thus, the model may be simplified in the vertical direction by limiting the connections to one node above and below the current node's layer.

However, in certain applications, the interconnectivity between layers may be beneficial. For instance, when there are pinchouts (i.e., partially missing layers in a reservoir model), a node in the flow network is connected to the neighbor nodes in the upper and lower immediate connected layers after removing each of the pinchout layers. Also, if fault throws (e.g. layers across a fault are disconnected and misaligned) are present in a reservoir model, a node can connect to neighbors in many layers based on the different fault connections. For example, one layer on the one side of a fault plane is physically connected to several layers on the other side of the fault plan, which is common in the faulted reservoir models.

After the 3D flow network model is formed, as discussed above, network properties are assigned within the flow network model. The network properties include volume properties and flow properties that may be used to build the fluid travel time models. The volume properties, such as volume, pore volume, and hydrocarbon pore volume, of the control volume are assigned to each node while the flow properties between nodes are assigned to each connection. The assignment of volume properties may include specifying each node directly with the volume properties of each reservoir model cell.

However, the assignment of flow properties may be complicated and involve calculating various properties that are distributed to individual connections between the nodes. For this assignment, flow properties are assigned to individual nodes from the reservoir cells and then flow properties are calculated for different connections, which may involve different calculations for different properties. For instance, permeability for a connection may be calculated using harmonic mean of the permeabilities of the two connected nodes, while porosity and fluid properties for a connection may be calculated using arithmetic mean. To assign the fluid travel times to the connections, various calculations may be utilized.

As an example of determining fluid travel time, Darcy's law may be utilized. Darcy's law is defined by the following equation:

$$\vec{v} = -\frac{K}{\phi} grad(h + z) \quad (1)$$

where $\vec{v}$ is interstitial velocity (with units L/T, L is length (meters) and T is time (seconds)); K is hydraulic conductivity (with units L/T); $\phi$ is porosity (dimensionless); h is hydraulic head (with units L); and z is elevation (with units L). The hydraulic conductivity K is defined by the equation:

$$K = \frac{kg\rho}{\mu} \quad (2)$$

where k is permeability (with units $L^2$, absolute permeability for a single phase flow or phase permeability for a multiple phase flow); g is gravitational acceleration constant (with units $L/T^2$); $\rho$ is fluid density (with units $M/L^3$, M is mass (grams)); and $\mu$ is fluid viscosity (with units M/L/T).

Based on equation (1), travel time for a given connection i, which may be the connection between nodes $B^K$ and $B_6^K$, may be calculated using the following equation:

$$t_i = \frac{d_i}{\vec{v} \cdot \vec{n}_i} \quad (3)$$

where $d_i$ is the length of connection i (with units L); and $\vec{n}_i$ is a unit vector parallel to connection i (dimensionless). Because flow network is non-dimensionalized, $d_i$ should be dimensionless. If $h_i$ is not available, we may assume that the hydraulic gradients (grad(h+z)) from a given node, such as node $B^K$, to its neighbor nodes are constant. Based on this assumption, travel time for connection i may be estimated using the following simplified equation:

$$t_i = \frac{\phi_i d_i}{K_i} \quad (4)$$

Equation (3), which is utilized when velocity is available, e.g., from fluid flow simulation, or equation (4), which is utilized when velocity is not available, is used to calculate fluid travel times for each of connections in the flow network model. The calculated fluid travel time value for a given connection is then stored as a property in the connection. The flow network model for the given reservoir model is complete when each of the nodes and connections are assigned appropriate properties.

Figure 6A:
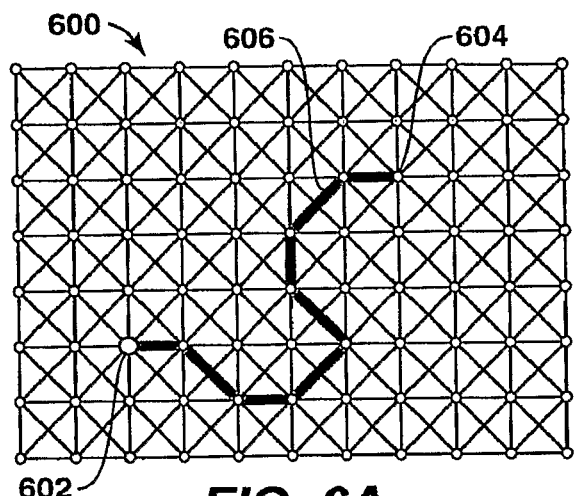
FIGS. 6A-6C are exemplary flow network models utilized in the flow chart of FIG. 2 in accordance with certain aspects of the present techniques.
Figure 6B:
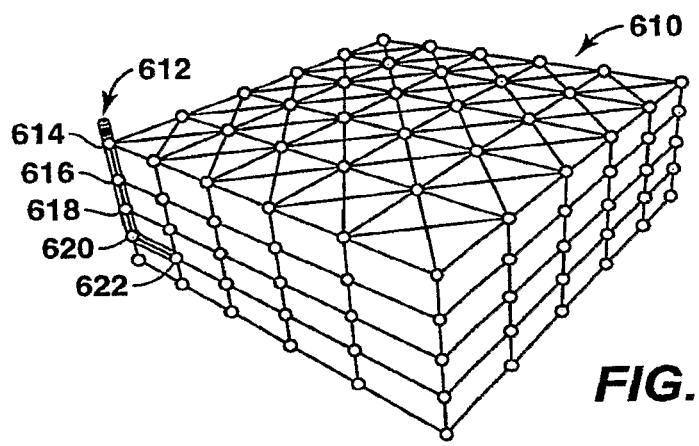
Figure 6C:
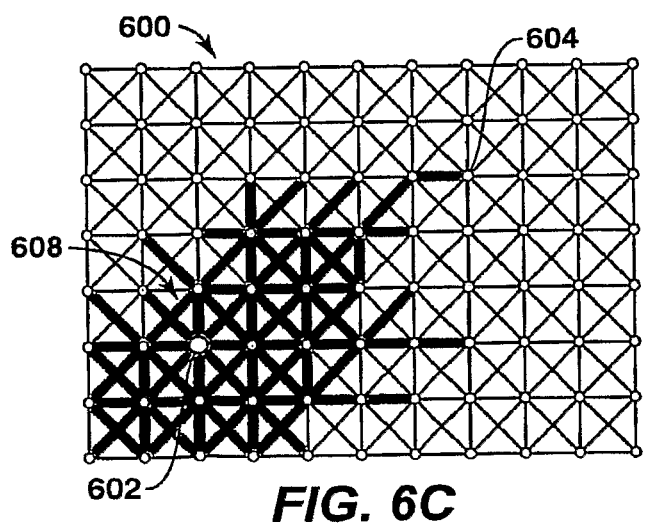

As an example of the use of the flow network models are shown below in FIGS. 6A-6C. As discussed above, a fluid travel time model is defined as the flow network model that contains fluid travel times from a given well (or a set of points) to every node in the flow network model. That is, each node in the fluid travel time model has a unique travel time from the well, which is a node or set of nodes, to the individual nodes. In FIGS. 6A and 6B, exemplary embodiments of a single well 602 in a 2D flow network model 600, which may be one of the 2D flow network models discussed above, is shown. The well 602 is defined as a set of nodes through which the well 602 passes, which in this embodiment is a single node. Similarly, in FIG. 6B, an exemplary embodiment of a single well 612 in a 3D flow network model 610, which may be one of the 3D flow network models discussed above, is shown. The well 612 is defined as a set of nodes 614, 616, 618, 620 and 622. The nodes 614, 616, 618, 620 and 622 in the well 612 are interconnected and treated as a single source. It should be noted that these wells may be a vertical well with partial or full penetration, or alternatively, a well having deviations that are horizontal and of variable lengths.

Regardless, with the well defined, the flow network model, such as model 600 or 610, the fluid travel time model may be treated as a single source shortest paths (SSSP) problem. With this type of problem, the shortest paths in a flow network model may be computed in network optimization or in the graph theory. The flow network model may be represented as a graph that is composed of the set of nodes and connections or edges. Each connection has an associated numerical weight, which is the fluid travel time from one end of the connection to the other end of the connection. The weight of a path may be defined as the sum of the weights of connections along the path. As such, a shortest path connecting one node and another non-neighbor node is a path of minimum weight or cost.

For instance, Dijkstra's algorithm may be implemented using Fibonacci heaps to compute shortest paths and their associate fluid travel times from the well to each node in the flow network model. See Pardalos, P. M. and Resende, M. G. C. (Edited), Handbook of Applied Optimization, Oxford University Press pp. 376-382 (2002). As a specific example, the shortest fluid travel time path 606 between well 602 and a node 604 in the flow network model 600. The fluid travel time from the well 602 to node 604 is equal to the cumulative travel time along the path 606. This cumulative fluid travel time is assigned to the node 604. In a similar manner, other fluid travel times for any other node in the flow network model may be calculated and assigned. Once each of the nodes in the flow network model have fluid travel times assigned from or to well 602, the construction of the fluid travel time model is completed.

Further, for a given fluid travel time, any node with the fluid travel time below or equal to a specific threshold fluid travel time may be connected to the well 602. For instance, in FIG. 6C, spanning trees 608 may include various paths (i.e. bolded connections and nodes) between and around the well 602 and the node 604. The spanning trees may be utilized in reservoir connectivity analysis because they may be utilized to calculate drainage volumes and interwell connected pore volumes, which is described further below.

Figure 7:
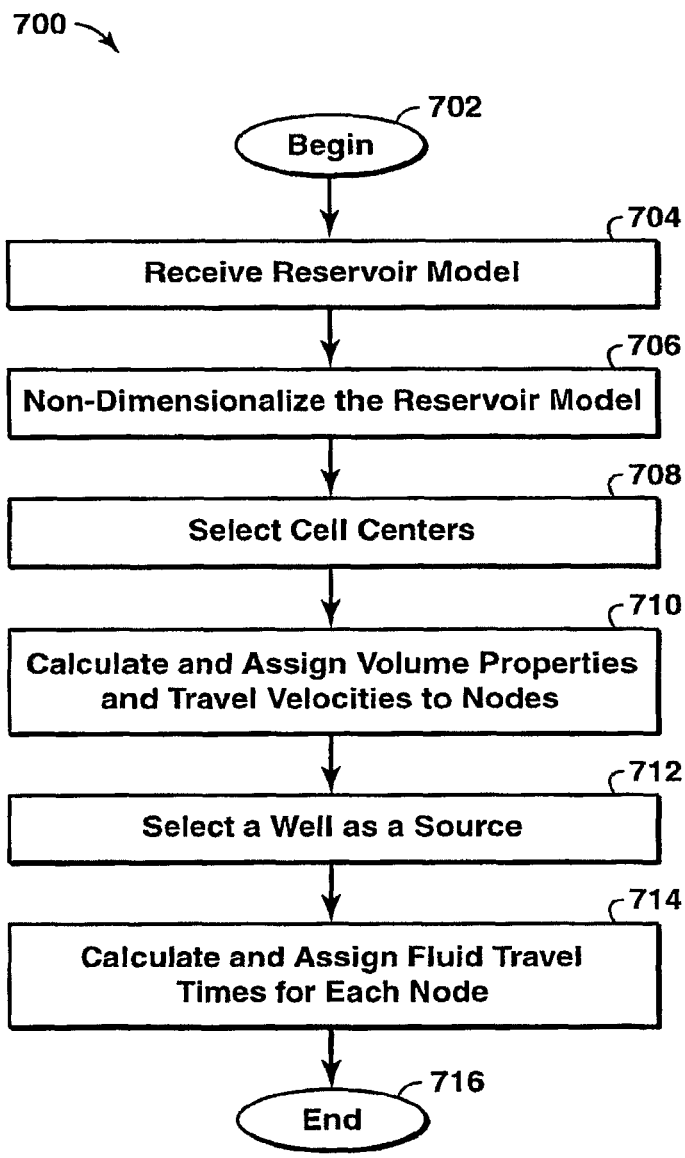
FIG. 7 is an exemplary flow chart for constructing the fluid travel time model in FIG. 1 based on front propagation method in accordance with certain aspects of the present techniques.

FIG. 7 is an exemplary flow chart for constructing the fluid travel time model in FIG. 1 based on a front propagation method in accordance with aspects of the present techniques. In this flow chart, which is referred to by reference numeral 700, the front propagation method is utilized to receive a reservoir model, build a node model from the reservoir model, and construct a fluid travel time model from the node model. Unlike a flow network model, a node model functions as if the nodes are imbedded in a continuous medium, which does not use connections. As a result, an infinite number of connections may be formed from one node to the neighbor nodes through the continuous medium. Without the finite number of connections between nodes, as in the flow network model, the node model provides a solution to a continuous problem rather than the flow network model solution, which is includes grid orientation errors. See Sethian et al. (1999). That is, the geometry errors (i.e. grid orientation errors) decrease as the distance between nodes decreases because it is a convergent modeling approach. While in flow network modeling, the geometry errors are reduced by increasing the neighbor nodes. As such, the node modeling may provide more accurate travel times than the flow network modeling by minimizing the grid orientation errors. However, as a tradeoff, the node modeling may run slower.

The flow chart begins at block 702. In blocks 704 and 706, the reservoir model is obtained. The reservoir model is received in block 704 and non-dimensionalized in block 706 in a manner similar to blocks 204 and 206 in FIG. 2. The node model may be built in blocks 708-710. At block 708, cell centers are selected as nodes. The selection of a cell center may include calculating the center coordinates (x, y, and z) of a cell and assigning the coordinate information to the node. Because the node model is composed of nodes only, which are described below in greater detail FIG. 8, volume properties and fluid travel velocities are assigned to each of the nodes, as shown in block 710. The calculation and assignment of volume properties to nodes, which may be similar to the discussion above, is a straightforward approach. The calculation and assignment of fluid travel velocities may be based directly on a fluid flow simulation or a fluid travel velocities estimation method, which is discussed below in FIGS. 9A-9C. When fluid travel velocities are assigned to each node, the magnitude of velocity is used for an isotropic system, while a velocity vector is applied for an anisotropic system.

From the node model, a fluid travel time model may be constructed in blocks 712-714. At block 712, a well is selected as a source. The selection of the well may be similar to the section of a well in block 214 in FIG. 2. A well may be vertical, deviated, and horizontal and may fully or partially penetrate the reservoir model, as noted above. After the well is defined, as discussed above, the calculation and assignment of fluid travel times for each node, as shown in block 714. The calculation of fluid travel times from the well to any nodes in the node model may utilize the fast marching method, which is described below in greater detail in FIGS. 9A-9C. After values are calculated, the values are assigned to the nodes to complete the fluid travel time model. Accordingly, the process ends at block 716.

Figure 8A:
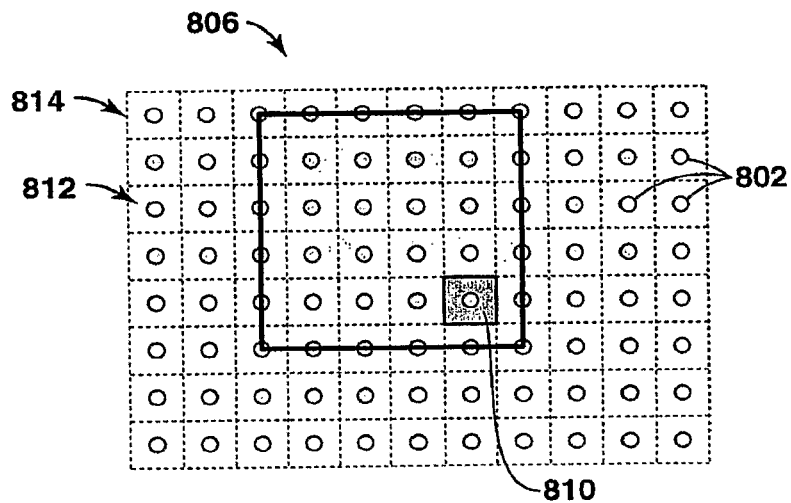
FIGS. 8A-8B are exemplary embodiments of the construction of a node model in the flow chart of FIG. 7.
Figure 8B:
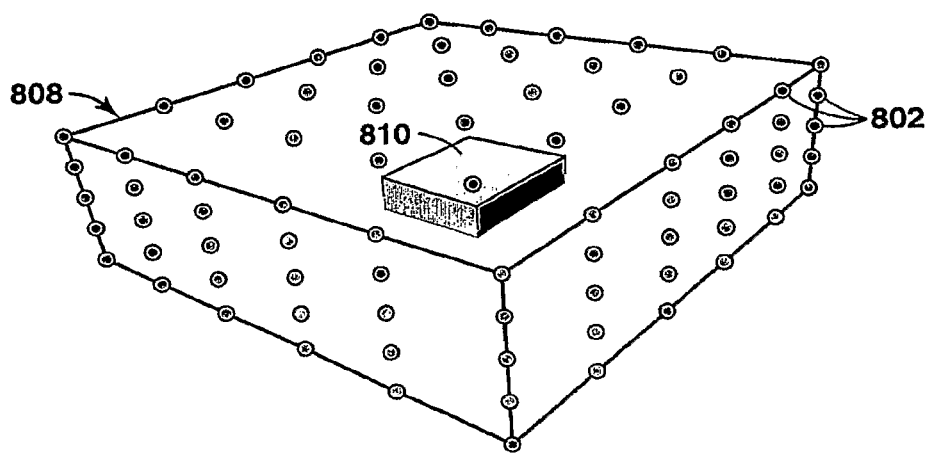

To further describe the flow chart 700 of FIG. 7, various embodiments of node models are described in FIGS. 8A-8B and 9A-9C. In particular, FIGS. 8A-8B are exemplary embodiments of node models utilized in the flow chart of FIG. 7. As noted above, a node model is composed of nodes 802 in an unstructured or structured grid, which are shown in a 2D node model 806 and a 3D node model 808. Each of the nodes 802 is a point (e.g. the center point) within a reservoir model cell 812 of the reservoir model grid 814 and stores the coordinates, such as x, y cell coordinates for the node model 806 or x, y, z cell coordinates for the node model 808, for of the center of the reservoir model cell 812. Also, a node may store the pore volume or hydrocarbon pore volume of a control volume 810 that contains the node. Accordingly, each of the nodes may have different numbers of neighbor nodes in a manner similar to the discussion above.

To calculate and assign the fluid travel velocities for a fluid travel time model, the fluid travel velocities may be based directly on a fluid flow simulation, as discussed in block 710 of FIG. 7. However, when a fluid flow simulation is not available, an approximation method may be utilized to estimate fluid travel velocity. Accordingly, using a similar assumption to the flow network model, fluid travel velocity may be described as a function of hydraulic conductivity divided by porosity for an isotropic system, which is defined by the following equation:

$$v = \frac{K}{\phi} \quad (5)$$

where K is hydraulic conductivity defined in Equation 2. Equation 5 may be used to calculate fluid travel velocity, and the velocity value is assigned to each node in the node model.

For an anisotropic system, a velocity vector for a node may be constructed using hydraulic conductivity and porosity between the node and its neighbor nodes. Similar to the flow network model approach discussed above, hydraulic conductivity is calculated using harmonic mean between two nodes while porosity is estimated using the arithmetic mean. In this manner, the fluid travel velocities may be calculated for an isotropic or anisotropic system.

Figure 9A:
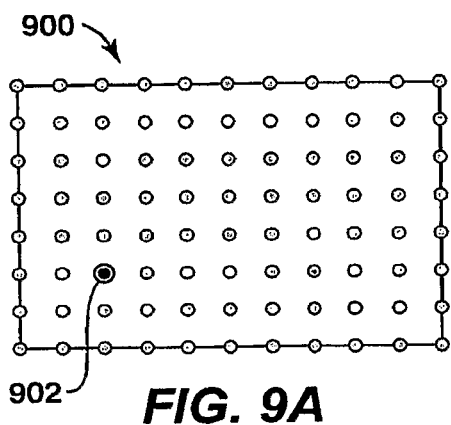
FIGS. 9A-9C are exemplary node models utilized in the flow chart of FIG. 7 in accordance with certain aspects of the present techniques.
Figure 9B:
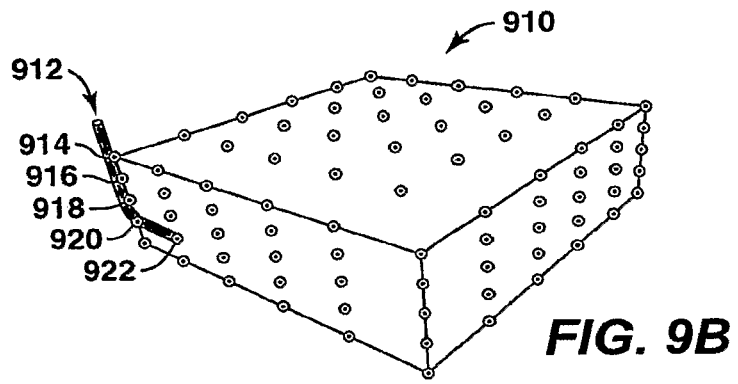
Figure 9C:
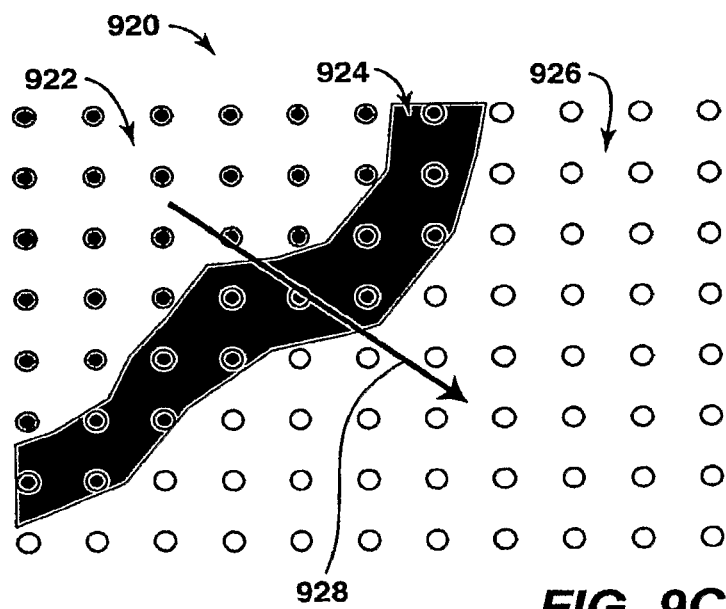

With the calculated volume properties and fluid travel velocities, a fluid travel time model may be constructed as shown in FIGS. 9A-9C. FIGS. 9A-9C are exemplary node models utilized in the flow chart of FIG. 7 in accordance with certain aspects of the present techniques. Similar to the graph theory approach discussed above, a well, which may include a node or set of nodes, is defined before building of a fluid travel time model. For instance, FIG. 9A includes an exemplary embodiment of a single well 902 in a 2D node model 900. The well 902 is defined as a set of nodes through which the well 902 passes. Similarly, FIG. 9B includes an exemplary embodiment of a single well 912 in a 3D node model 910. The well 912 is defined as a set of nodes 914, 916, 918, 920 and 922. The nodes 914, 916, 918, 920 and 922 are interconnected and treated as a single source. Again, as noted above, the nodes associated with the well function as a single source that may form a vertical, deviated and/or horizontal well and may fully or partially penetrate the reservoir model. Also, the nodes may include different areal schemes that have numbers of neighbor nodes.

Regardless, with the well defined, the fluid travel times from the well, which may be well 902 or 912, to any nodes in the node model, such as node model 900 or 910, may be calculated. The calculation may involve the fast marching method, which searches in a manner similar to the shortest path method discussed above. See Sethian et al. (1999). With the fast marching method, the nodes of the node model, such as node model 920, are classified into three regions, which are an upwind region 922, narrow band region 924, and downwind region 926, which are shown in FIG. 9C. In the fast marching method, a solution of travel time t is constructed in a "downwind" fashion, which follows the arrow 928. The algorithm is fast because it defines the "building zone" as a narrow band region 924, usually two nodes wide, around the front and searches the node to update only within the narrow band. An efficient heap algorithm is used to locate the node in the narrow band region 924 with the smallest value for t. As such, the fast marching method is slower than the shortest path method because of the computational time expended on solving the Eikonal equation. However, by utilizing the Eikonal equation, the orientation errors, which may below 1%, are typically less than the shortest path method. See Sethian et al. (1999). Once each of the nodes is searched and the values of t have been assigned, the fluid travel time model is complete.

Alternatively, for anisotropic systems, other fast marching methods may be utilized to solve fluid travel times for velocity as a function of location and a function of orientation. See Lin et al. (2003). Despite the use of different fast marching methods, the methods are performed in a similar manner to the discussion above.

Each of the fluid travel time models discussed above is associated with a single well. With a single well or source, connectivity measures are representative of a single well, not the entire reservoir model. Accordingly, the use of multiple wells in a model may provide statistics of reservoir connectivity measures for the entire reservoir model. However, placing wells throughout the reservoir model may be computationally inefficient and create storage issues for the associated data. As such, a subset of wells should be utilized to represent the entire reservoir model.

One method for placing a subset of wells within a reservoir model is to utilize random sampling techniques. Under this method, wells are randomly placed in a geologic or reservoir model and a fluid travel time model is constructed, as noted above, based on these randomly placed wells. Then, statistics of reservoir connectivity measures are estimated. The statistical properties generally converge when number of wells is above a certain threshold that is determined by the convergence test. A sampling process is converged if adding more wells does not alter the statistics for the fluid flow model. Thus, the use of random sampling techniques may reduce the number of wells and corresponding fluid travel time models that are utilized to provide statistics for the reservoir model, while being computational efficiency.

Figure 10B:
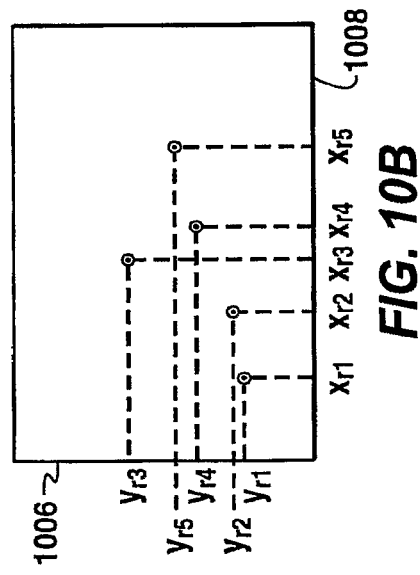
FIGS. 10A-10D are exemplary diagrams random sampling techniques utilized in the generation of multiple fluid travel time models in the flow chart of FIG. 1 in accordance with certain aspects of the present techniques.
Figure 10D:
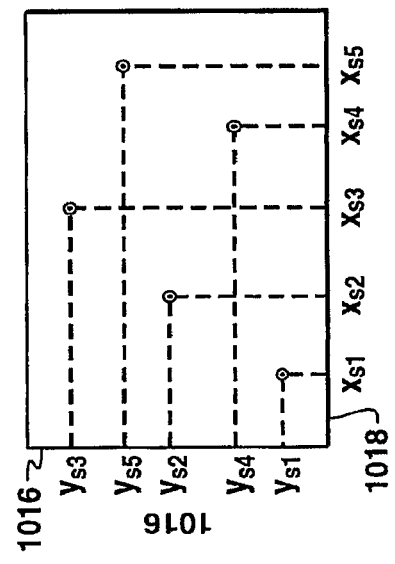
Figure 10A:
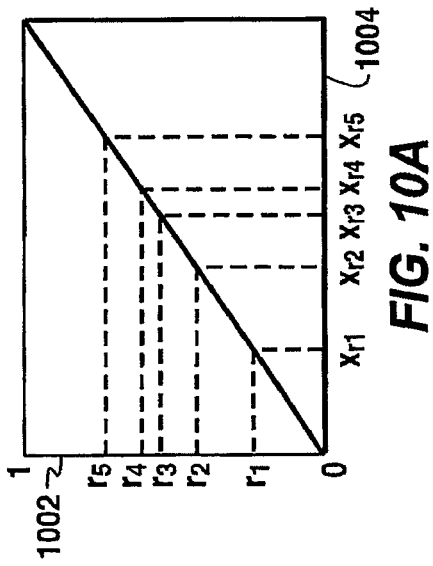

One method that may be utilized to provide randomly placed wells is Monte Carlo sampling (MCS) method, which is shown in FIGS. 10A-10B. FIGS. 10A-10B are diagrams of the Monte Carlo Sampling method that may be utilized to generate multiple fluid flow models in accordance with the flow diagram of FIG. 1. The Monte Carlo sampling (MCS) method may be utilized with vertical wells to demonstrate the use of random sampling techniques. The strategy of the MCS method is to randomly sample the variables (i.e. x and y coordinates) from the entire intervals of their cumulative probability distribution functions (CDF). First, a random number between 0 and 1 is generated and then the random number is used to read a random variable x or y from the CDF of x or y. This process is repeated numerous times to generate enough samples for Monte Carlo simulations.

As an example, in FIG. 10A, a line is formed between the CDF axis 1002 from 0 to 1 and the x axis 1004 from 0 to the end of the X axis in the reservoir model. Then, five random numbers (r1, r2, r3, r4, and r5) along the CDF axis 1002 are used to create five sample x coordinates (x1, x2, x3, x4, and x5) along the x axis 1004. Similarly, y coordinates (y1, y2, y3, y4, and y5 (not shown)) may also be generated by this technique. Then, the x coordinates (x1, x2, x3, x4, and x5) are matched with the y coordinates (y1, y2, y3, y4, and y5). From this matching of the x coordinates (x1, x2, x3, x4, and x5) along an x axis 1006 and the y coordinates (y1, y2, y3, y4, and y5) along a y axis 1008, the locations of the wells determined, as shown in FIG. 10B. As such, the MCS method may be utilized to provide well locations to reduce the number of fluid flow models that may be generated.

Figure 10C:
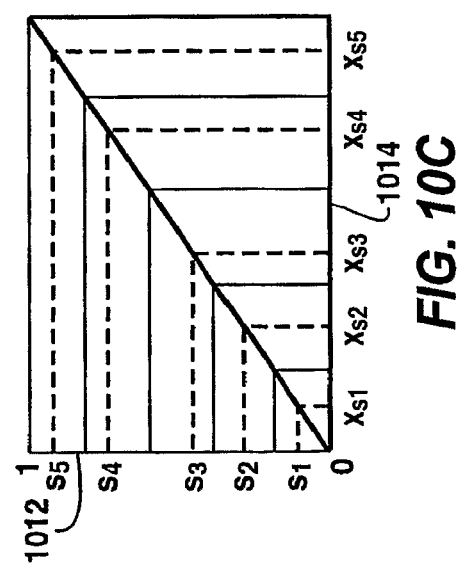

However, the MCS method converges slowly because this sampling technique lacks the area control of the well locations. That is, more wells (i.e. travel time models) are utilized for reservoir connectivity studies to provide uniform coverage of the entire reservoir model domain. Accordingly, another method that may be utilized is the Latin Hypercube Sampling (LHS) method, which is shown in FIGS. 10C-10D. See McKay, M. D., Beckman, R. J., and Conover, W. J.: "A Comparison of Three Methods for Selecting Values of Input Variables in the Analysis of Output from a Computer Code," Technometrics, Vol. 21, No. 2, pp. 239-245 (May 1979). In FIGS. 10C-10D, charts of the LHS method are utilized to generate multiple fluid flow models in accordance with the flow diagram of FIG. 1. The LHS method speeds up the convergence of the sampling process, and further reduces the number of samples (i.e. wells) utilized in comparison to the MCS method. The LHS method divides the CDF interval [0, 1] into equal-spaced subintervals, and performs the MCS method in each subinterval. The LHS method randomly samples in the equal probability intervals, and randomly pairs each of the sampled variables (i.e. x and y coordinates). The number of samples for the LHS method is equal to the number of intervals used to divide the entire domain for a given CDF. Because the random sampling is performed in subintervals, the LHS method provides uniform coverage for the entire reservoir model domain with equal probability. This stratified sampling strategy reduces duplicate or unnecessary samples, which enhances the process by making it more computationally efficient.

For instance, suppose each variable (i.e. coordinate axis) is subdivided into n intervals. The n values from x axis are paired at random and without replacement with the n values obtained for y axis. These n pairs constitute the Latin hypercube sample. Because the pairing process is random, the resulting Latin hypercube sample may provide multiple pairs. If there is no correlation among the variables, the final Latin hypercube sample may be chosen to maintain the minimum correlation between x and y coordinates. While overlapped and correlated samples may occur, only the sample with minimum correlation is selected as the Latin hypercube sample.

A specific example of this method is shown in FIGS. 10C-10D. In FIG. 10C, a line is formed between the CDF axis 1012 from 0 to 1 and the x axis 1014 from 0 to the end of the X axis in the reservoir model. Five equal probability intervals ($b_1$, $b_2$, $b_3$, $b_4$, $b_5$) are formed along the CDF axis 1012, and correspond to values on the x axis 1014. Then, a random number (s1, s2, s3, s4, and s5) is generated in each interval and used to create five sample x coordinates ($x_{s1}$, $x_{s2}$, $x_{s3}$, $x_{s4}$, and $x_{s5}$) along the x axis 1014. Again, a similar method may be used to create the y coordinates ($y_{s1}$, $y_{s2}$, $y_{s3}$, $y_{s4}$, and $y_{s5}$ (not shown)). After the values of each variable (i.e. x or y coordinates) have been obtained, the variables, such as x coordinates ($x_{s1}$, $x_{s2}$, $x_{s3}$, $x_{s4}$, and $x_{s5}$) and the y coordinates ($y_{s1}$, $y_{s2}$, $y_{s3}$, $y_{s4}$, and $y_{s5}$) are paired together in a random manner. From this pairing of the x coordinates ($x_{s1}$, $x_{s2}$, $x_{s3}$, $x_{s4}$, and $x_{s5}$) along the x axis 1018 and the y coordinates ($y_{s1}$, $y_{s2}$, $y_{s3}$, $y_{s4}$, and $y_5$) along the y axis 1016, the locations of the wells are determined, as shown in FIG. 10D. As such, the LHS method may be utilized to provide well locations to reduce the number of fluid flow models that may be generated.

Regardless of the sampling method, once the well locations are determined, either the graph theory method or the front propagation method may be used to build the fluid travel time models for each of the wells. If the graph theory method of FIG. 2 is utilized, blocks 214-218 are repeated to build the fluid travel time models. Alternatively, if the front propagation method of FIG. 7 is utilized, blocks 712 and 714 are repeated to build the fluid travel time models. Beneficially, the reduced number of fluid travel time models may reduce the amount of storage utilized and number of computations.

With the fluid travel time models, the reservoir connectivity measures may be calculated and analyzed, as noted above in FIG. 1. Typically, reservoir connectivity, which may be referred to as connectivity, may be defined using a single parameter in some applications, while other applications may have different definitions and meanings of reservoir connectivity. Accordingly, reservoir connectivity under the present techniques is measured in several different dimensions (or aspects). First, reservoir connectivity may be measured based on a time dimension. For example, if fluid in one reservoir takes a shorter time to reach the same connected pore volume than the other reservoir, the former reservoir is believed to have better connectivity than the latter reservoir. That is, the reservoir with the shorter time for a given pore volume has a better connectivity. Second, reservoir connectivity may be measured based on a size dimension. Within a given time frame (e.g., reservoir producible time period), if one reservoir has a larger connected pore volume than the other reservoir, the former reservoir is better connectivity than the latter reservoir. Third, reservoir connectivity may be measured based on an orientation dimension. That is, the reservoir connections may be better in one direction than others due to reservoir anisotropic properties. Finally, the reservoir connectivity may be measured in a space dimension. For example, the connected pore volume between two wells may be a function of the well spacing. As the well spacing increases, the connected pore volume between the two wells may decrease. As such, the present techniques measure reservoir connectivity in four dimensions, such as time, size, orientation, and space.

In addition, reservoir connectivity is also influenced by recovery processes. For instance, connected pore volume for a well in primary recovery may not be the same as the connected pore volume for the same well in secondary and tertiary recoveries. That is, the hydrocarbons in the pore volume connected to the well may be produced in primary depletion or recovery, while only the hydrocarbons in the pore volume connected to both the injector and producer may be produced in secondary and tertiary recoveries. Considering these recovery processes, the reservoir connectivity measures are classified into measures for primary depletion or recovery and reservoir connectivity measures for secondary and tertiary recoveries.

Further, reservoir connectivity measures may also be divided into global and local approaches. The global approach focuses on the characteristics of the entire reservoir model, while the local approach focuses on specific locations in the reservoir model. Global reservoir connectivity measures may be used to quantitatively compare different reservoir models and to study the behavior of the entire reservoir model. The local reservoir connectivity measures may be applied to the behaviors of the local reservoir model, such as connectivity between an injector and a producer or connectivity across a fault. As such, reservoir connectivity measures may be examined for primary depletion and secondary and tertiary recoveries with the global approach and then with the local approach for secondary and tertiary recoveries.

Figure 11:
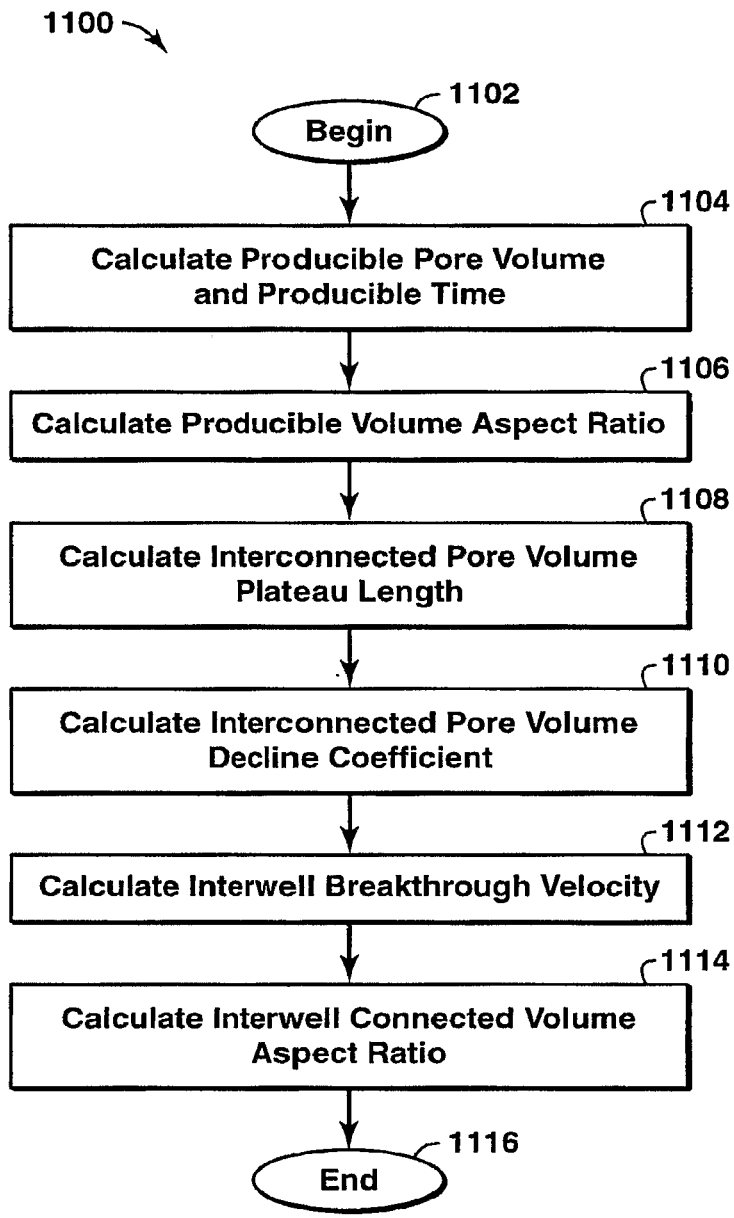
FIG. 11 is an exemplary flow chart for calculating and analyzing reservoir connectivity in the flow chart of FIG. 1 in accordance with certain aspects of the present techniques.

FIG. 11 is an exemplary flow chart for calculating and analyzing reservoir connectivity measures in the flow chart of FIG. 1 in accordance with certain aspects of the present techniques. In this flow chart, which is referred to by reference numeral 1100, the reservoir connectivity measures are calculated and analyzed by determining the reservoir connectivity measures for primary depletion, determining the reservoir connectivity measures for secondary and tertiary recoveries, and determining local connectivity measures. The determination of the reservoir connectivity measures for the primary depletion, secondary recovery and tertiary recovery being global reservoir connectivity measures. Beneficially, with this process, different reservoir models with different scales/grids may be validated, analyzed, compared, and measured using the global reservoir connectivity measures.

The flow chart begins at block 1102. In blocks 1104 and 1106, the reservoir connectivity measures for primary depletion are determined. At block 1104, a producible pore volume (PPV) and producible time (PT) are calculated. The PPV measures the size of the producible pore volume (i.e., the size dimension of reservoir connectivity) and PT measures the time to produce the PPV (i.e., the time dimension of reservoir connectivity). The calculation of these values is discussed further below in FIGS. 12A-12C and 13A-13D. At block 1106, the producible volume aspect ratio (PVAR) is calculated. The PVAR, which is discussed further below in FIG. 14A-14B, is utilized to provide the orientation dimension of reservoir connectivity. PPV, PT and PVAR are utilized to provide global information about the reservoir connectivity.

Then, the reservoir connectivity measures for the secondary and tertiary recovers are determined in blocks 1108-1110. The reservoir connectivity for secondary and tertiary recoveries is different from the reservoir connectivity for the primary depletion because multiple wells are utilized in these processes. At block 1108, the interconnected pore volume plateau length may be calculated. Then, at block 1110, the interconnected pore volume decline coefficient may be calculated. The interconnected pore volume plateau length and interconnected pore volume decline coefficient, which are discussed further below in FIGS. 15A-15B, involve the well spacing (i.e., the distance between an injector and a producer). These parameters may be calculated to provide the fourth dimension of reservoir connectivity.

Figure 16A:
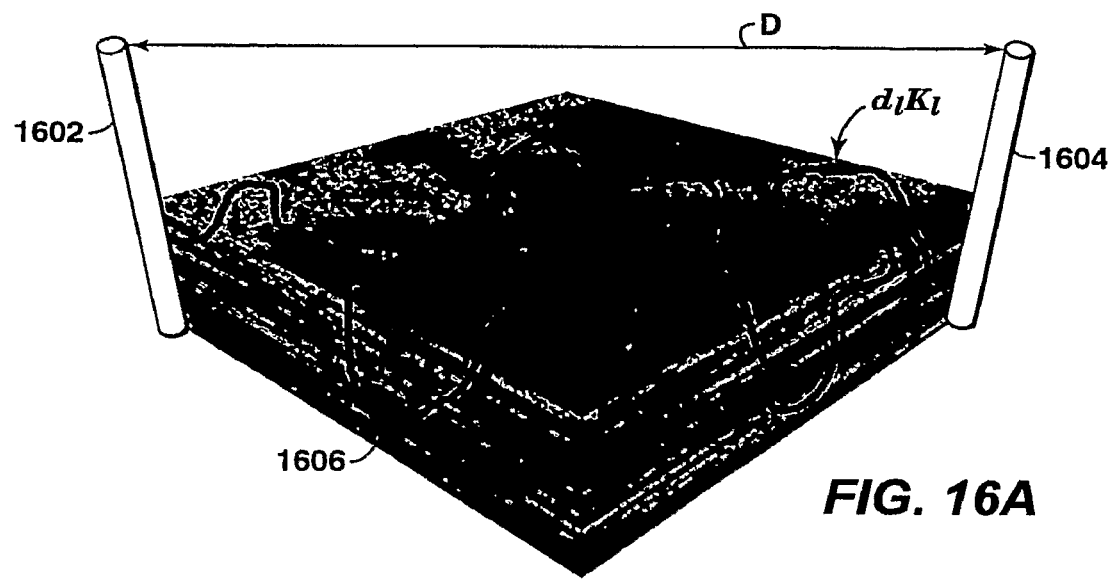
FIGS. 16A-16B are different diagrams utilized to provide local reservoir connectivity measures for the flow chart of FIG. 11.
Figure 16B:
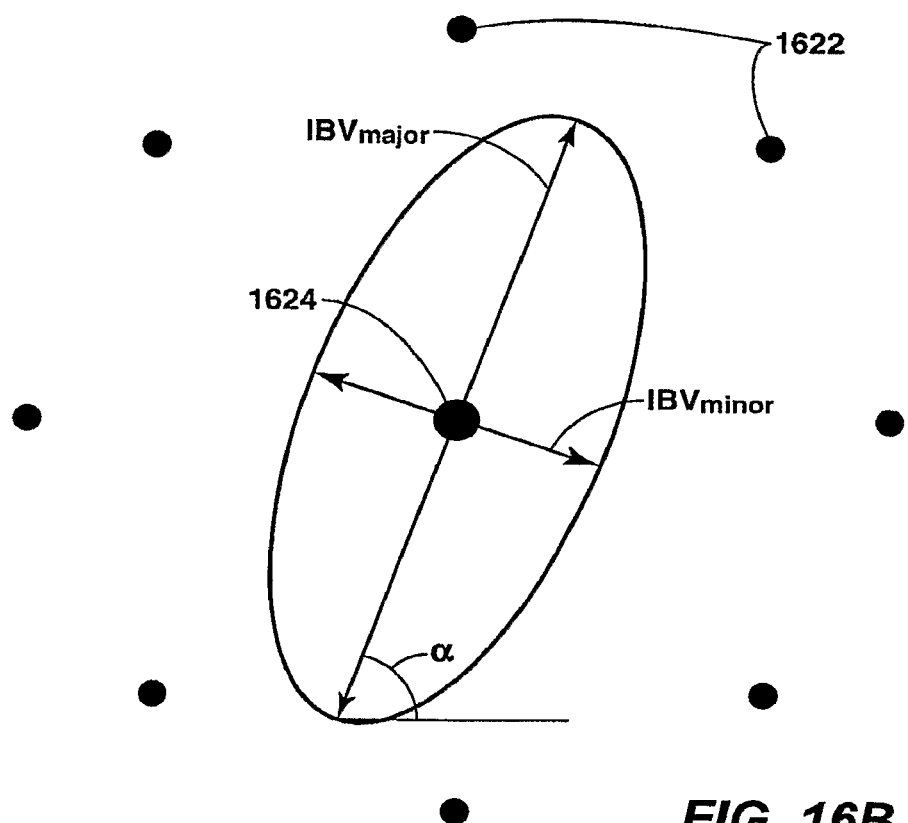

Once the global reservoir connectivity measures are calculated, the local reservoir connectivity measures may be calculated in blocks 1112-1114. At block 1112, the interwell breakthrough velocity is calculated. The IBV measures the velocity of injected fluid moving from an injector well to a producer well, wherein larger values of IBV indicate a better connection between the injector well and the producer well. Then, the interwell connected volume aspect ratio (ICVAR) is calculated, as shown in block 1114. ICVAR is utilized to measure the shape and orientation of interwell connected volume. The IBV and ICVAR, which are discussed further in FIGS. 16A-16B, are utilized to provide local reservoir connectivity measures. Accordingly, the process ends at block 1116.

Figure 12A:
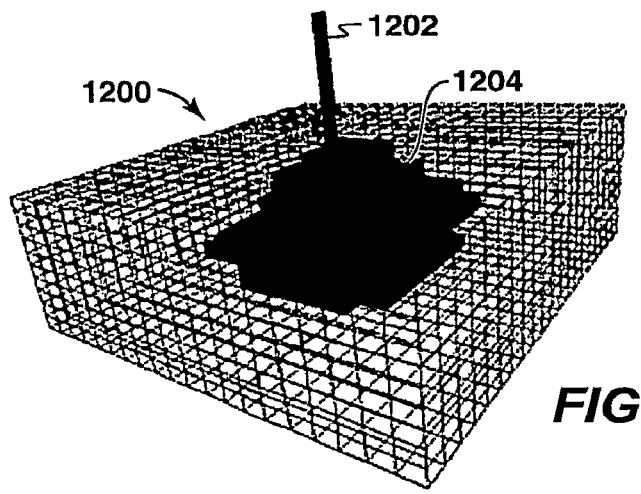
FIGS. 12A-12C are an exemplary fluid travel time model and charts utilized in the flow chart of FIG. 11.
Figure 12B:
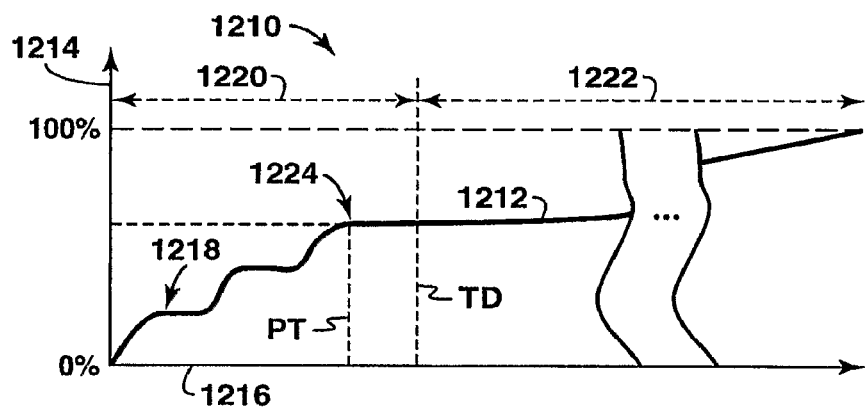
Figure 12C:
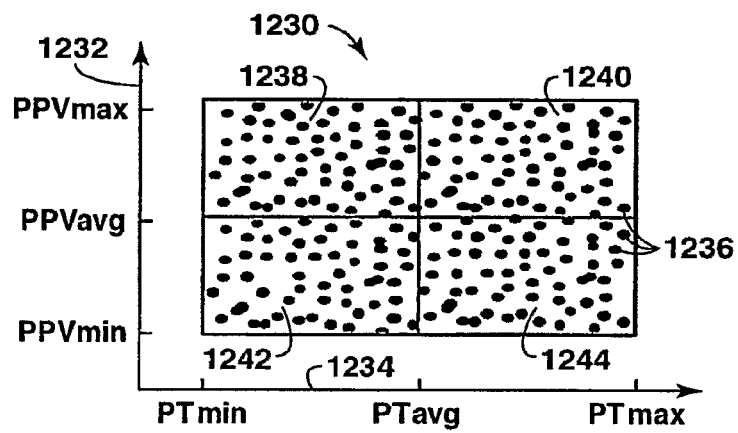
Figure 13A:
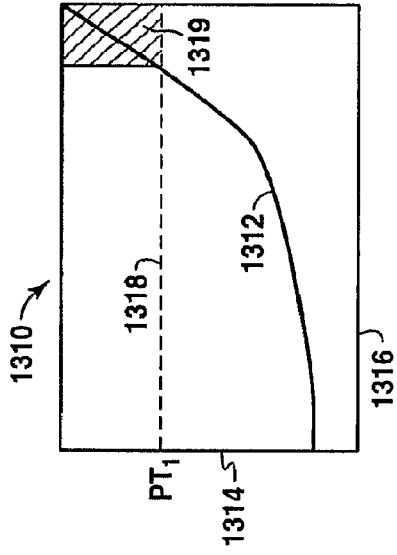
FIGS. 13A-13D are different diagrams utilized to select well locations based on producible pore volume (PPV) or producible time (PT) values in the flow chart of FIG. 11.
Figure 13B:
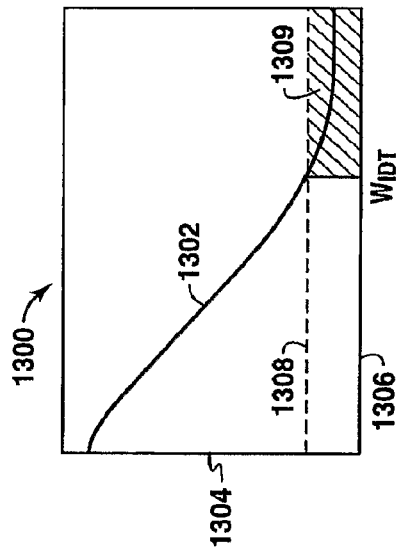

To further describe the flow chart 1100 of FIG. 11, various embodiments of fluid flow networks are described in FIGS. 12A-12C and 13A-13D. In particular, FIGS. 12A-12C are an exemplary embodiment of fluid travel time model and charts utilized in the flow chart of FIG. 11. As noted above, a fluid travel time model for a single well has the times for fluid traveling from the well to each of the nodes in the fluid travel time model. As a result, the times for fluid traveling in each node it utilized to construct the pore volume produced (PVP) as a function of time. Again, the PVP for time t is defined as the cumulative volume of fluid produced at this time divided by the total (hydrocarbon) pore volume of the geologic/reservoir model. The cumulative volume of fluid produced at time t may be calculated using the sum of the (hydrocarbon) pore volumes of the nodes with travel times that are smaller than or equal to time t.

As an example, FIG. 12A is an exemplary fluid travel time model 1200 having a well 1202, which is a producer well. The object 1204 in the fluid travel time model 1200 is the PVP at a given time. Based on this definition, the PVP, as defined by the object 1204, is a fraction or percent of total (hydrocarbon) pore volume produced at time t. The PVP shows the pore volume being drained from the reservoir at time t. The shape of the PVP may be very irregular depending on the connection structure of the pore volume. In this model 1200, the PVP increases as the time increases.

In FIG. 12B, an exemplary chart 1210 of the characteristics of a PVP curve 1212 as a function of time is shown. In general, the values of the PVP curve 1212 increase with PPV axis 1214 and the time axis 1216. Along the time axis 1216, the PVP curve may be divided into a production life 1220, which is before a specific time TD, and a geologic life 1222 that extends beyond the specific time TD. Along the PVP curve 1212, at least one plateau 1218 is reached during the reservoir production life 1220, which is typically about ten years. A plateau represents a time period in which reservoir fluids travel through the relatively low connectivity rocks. During the production life 1220, the producible pore volume (PPV) may be defined as the values along the PVP curve 1212 and the producible time (PT) as the time associated with the beginning of the last plateau 1224. In this diagram, the behaviors of the reservoir connections within the reservoir production life are utilized because reservoirs are all perfectly connected (100% of PVP) when time approaches infinity in the geologic life 1222.

To obtain the PPV and PT values for the entire model, the statistics of the calculated PPV and PT values of the multiple fluid travel time models may be utilized. The statistical properties of PPV and PT values may provide useful information about reservoir model connectivity. The statistical properties for PPV are PPV mean (PPVavg), PPV standard deviation (PPVstd), PPV minimum (PPVmin), and PPV maximum (PPVmax). Similarly, the statistical properties for PT are PT mean (PTavg), PT standard deviation (PTstd), PT minimum (PTmin), and PT maximum (PTmax). PPVavg and PTavg measure the entire model connectivity, while PPVstd and PTstd measure the heterogeneity of the entire fluid travel time model. For more heterogeneous fluid travel time models, the values of PPVstd and PTstd are larger. The values of the PPVmin, PPVmax, PT min and PTmax are the extremes of the PPV and PT, respectively.

Using PPV and PT values obtained from multiple fluid travel time models may be utilized to analyze the reservoir connectivity characteristics in the reservoir model. For instance, FIG. 12C is a diagram 1230 of a matrix plot for a reservoir model along a PPV axis 1232 and PT axis 1234. Within the diagram 1230, each of the different points 1236 represent a point of (PT, PPV) calculated from a fluid travel time model, which is a different result for the different fluid travel time models. The values are bounded between PPVmin and PPVmax along the PPV axis 1232 and between PTmin and PTmax along the PT axis 1234. The values of PPVavg and PTavg divide the bounded domain into four regions, such as first region 1238, second regions 1240, third region 1242 and fourth region 1244.

Each of the regions, such as first region 1238, second regions 1240, third region 1242 and fourth region 1244, provide information about the reservoir connectivity. For instance, the first region 1238, which may be referred to as the "super star" region, refers to points that have large PPV (i.e. above PPVavg) and produce in an efficient manner (i.e. below PTavg). The first region 1238 has the highest reservoir connectivity and thus well locations access large pore volumes and produce efficiently. The second region 1240 may be referred to as the "high potential" regions because each of the wells in this region have large PPVs (i.e. above PPVavg), but are inefficient to produce (i.e. above PTavg). The second region 1240 has high potential, but may have to be stimulated to improve reservoir connectivity. Accordingly, well locations in the second region 1240 may be utilized if the stimulation methods are not too expensive or if a longer production life is acceptable. The third region 1242 may be referred to as a "small star" because of the small PPVs (i.e. below PPVavg), but efficient production (i.e. below PTavg). For wells in this region, a high well density may be utilized to enhance reservoir connectivity. The fourth region 1244 is referred to as a "low potential" region because for wells in this region have small PPVs (i.e. below PPVavg) that are inefficient to produce (i.e. above PTavg). This region has the lowest reservoir connectivity of each of the regions.

Further, the PPV and PT may also be utilized to select the optimal well locations based on economic thresholds. The use of economic thresholds is further explained in FIGS. 13A-13D, which are different diagrams utilized to select well locations based on PPV or PT values. In FIG. 13A, a diagram 1300 may be utilized with an economic threshold 1308 to exclude certain candidate wells. In FIG. 13A, a sorted PPV curve 1302 that is monotonically decreasing is shown as a function of the well ID (identification) against a PPV axis 1304 and a well ID axis 1306. Wells with PPVs smaller than an economic threshold 1308 may be excluded from the potential well candidates because the wells cannot produce sufficient hydrocarbon volume to meet the given economic threshold. As such, wells within the region 1309, which includes well ID values above the well ID $W_{IDT}$, are wells that may be excluded.

Similarly, other wells that may be excluded may include wells that have PTs longer than an economic threshold. For instance, FIG. 13B is a diagram 1310 may be utilized with an economic threshold 1318 to exclude certain candidate wells based on the PTs. In FIG. 13B, a PT curve 1312 is shown as a function of the well ID against a PT axis 1314 and a well ID axis 1316. Wells with PTs above the economic threshold 1318 may be excluded from the potential well candidates. These wells may be located in the region 1319, which includes PT values above $PT_1$.

Figure 13C:
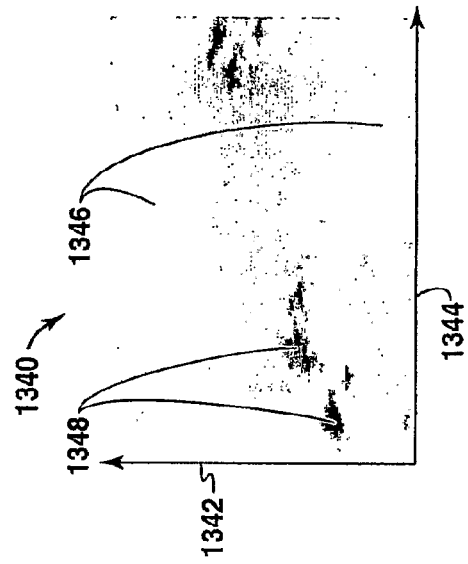
Figure 13D:
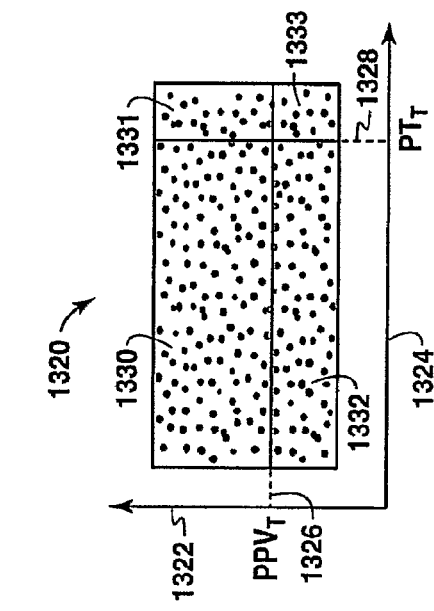
Figure 14A:
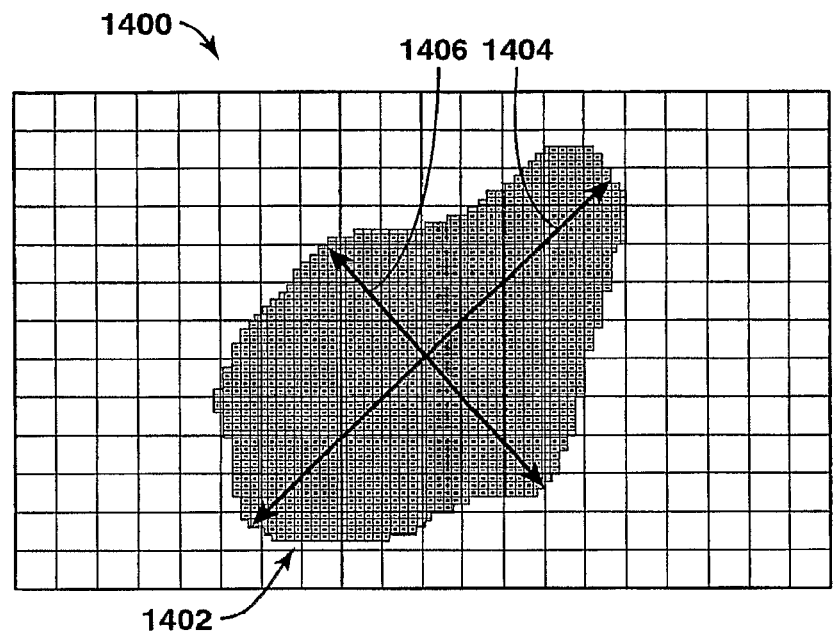
FIGS. 14A-14B are different diagrams for PVAR utilized to provide the orientation dimension of reservoir connectivity in the flow chart FIG. 11.
Figure 14B:
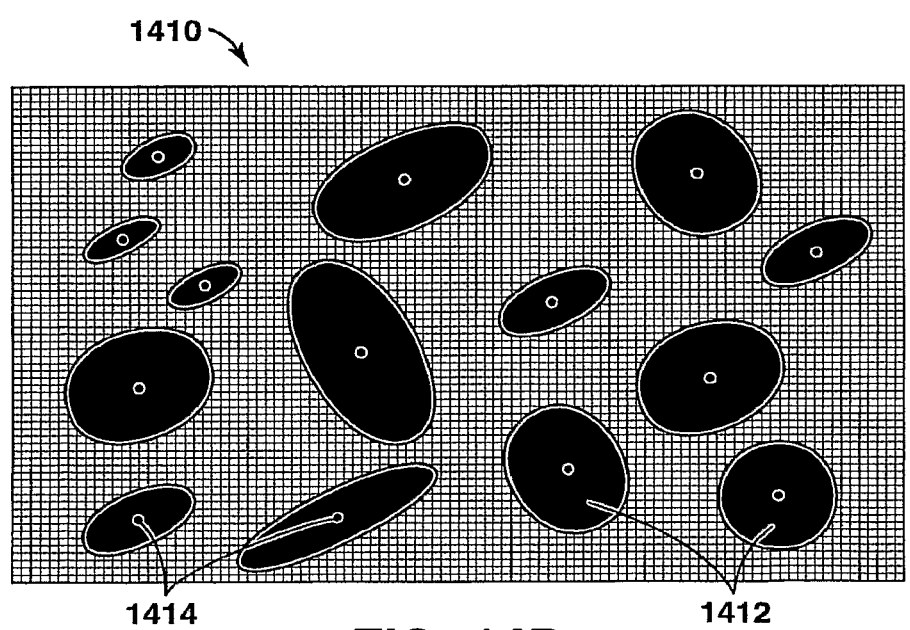

As another perspective of the well selection is shown in FIGS. 13C and 13D, which are different diagrams of connectivity regions that may be utilized together to determine well locations. In FIG. 13C, a diagram 1320 having different regions, such as regions 1330-1333, for well locations is shown against a PVP axis 1322 and a PT axis 1324. Within the diagram 1320, a PPV economic threshold 1326 extends from a specific PPV value $PPV_T$ and a PT economic threshold 1328 extends from a specific PT value $PT_T$. Based on the regions 1330-1333 formed by the economic thresholds 1326 and 1328, wells in the region 1330 are preferred, while wells in regions 1331-1333 are below one or more of the economic thresholds 1326 and 1328. This is also shown in FIG. 13D, which is a PPV map 1340. In the PPV map 1340, light or warm colored areas 1346 represent are high PPV values and dark or cold colored areas 1348 represent low PPV values along an x axis 1342 and a y axis 1344. The PPV map 1340 may indicate high PPV regions, but may represent good well locations because of inadequate time information. Accordingly, the PPV map 1340 and connectivity regions 1330-1333 may be utilized together to enhance the well selection process. This may be performed by selecting a good location from the PPV map and then checking to determine if the location falls in the preferred region 1330.

In addition to the PPVs and PTs, the producible volume aspect ratio (PVAR) may also be utilized to measure reservoir connectivity. PVAR is defined as the ratio of the length of the major axis of the map-view shape of a producible volume to the length of its minor axis, which is shown further in FIG. 14A. For example, FIG. 14A is a diagram 1400 of a producible volume shape 1402. The length 1404 of the producible volume shape 1402 is divided by the width 1406 of the producible volume shape 1402 to provide a PVAR in 2D. Additional aspect ratio may be defined for a three or more dimensional axis. For example, the producible volume aspect ratio between horizontal and vertical directions (PVARhz) may be defined as the ratio of the average length of the horizontal major and minor axes to the length of the vertical axis of the producible volume shape.

For simplicity the PVAR is further explained for regions that do not intersect the model boundary and regions that intersect the model boundary. If the producible volume shape does not intersect the model boundary, the PVAR may be calculated as described below. Once the producible volume shape intersects the model boundary, the length of the major or minor axis of the shape, such as producible volume shape 1402, is no longer valid. In this region, the distance from the well to a point on the model boundary that has the shortest travel time may be used as the radius to draw a circle. Then, the PVAR may be estimated as the ratio of the longest travel time to the shortest travel time on the circle. Because, the PVAR may vary in the fluid travel time model from one place to another, the statistical properties of PVAR may be utilized to characterize the entire reservoir model. These statistical properties may include PVAR mean (PVARavg), PVAR standard deviation (PVARstd), PVAR minimum (PVARmin), and PVAR maximum (PVARmax). The PVARavg is the average of PVAR, while PVARstd indicates the heterogeneity of PVAR for the reservoir model.

As discussed above, the PPV map 1340 of FIG. 13D only indicates the optimal well locations based on the size of PPV without the knowledge of the shape and orientation of the producible volume. However, combining PVAR with PPV may create a bubble map that provides not only the producible pore volume, but also the shape and orientation of the volume for some selected locations. For instance, FIG. 14B is a diagram of a bubble map 1410. This bubble map 1410 provides information related to the size, shape, and orientation in a single view or diagram. In the bubble map 1410, the size of a bubble-shaped region 1412 with specific points 1414 that is located in the center of each shape shows the magnitude of the PPV, while the orientation of the longer axis of the shape illustrates the orientation of the PPV. The points 1414 may be the preferred or optimal locations for wells.

Once the reservoir connectivity measures for the primary depletion have been determined, the reservoir connectivity measures for secondary and tertiary recoveries may be determined. The reservoir connectivity for secondary and tertiary recoveries is different from the reservoir connectivity for the primary depletion. For example, only connectivity to a producer or individual wells is utilized in calculating the reservoir connectivity measures for a primary depletion. However, reservoir connectivity between an injector and a producer may be utilized in the secondary and tertiary recovery processes. Further, well spacing (i.e., the distance between an injector and a producer) may vary to maximize recovery efficiency. Because reservoir connectivity may be a function of well spacing (i.e., the fourth dimension of reservoir connectivity), two parameters, such as interconnected pore volume plateau length and interconnected pore volume decline coefficient, may be calculated to measure reservoir connectivity in the spacing dimension.

Figure 15A:
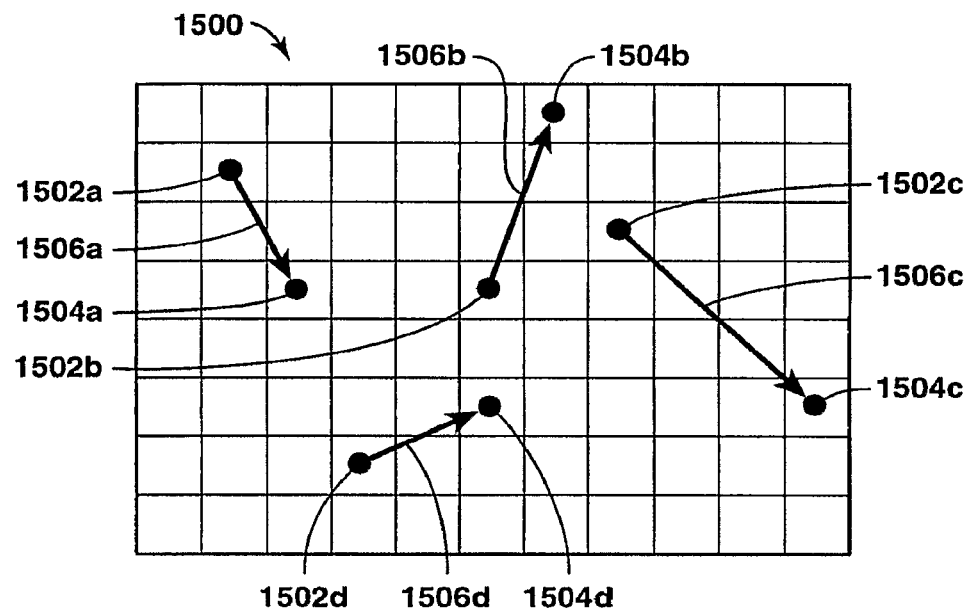
FIGS. 15A-15B are different diagrams utilized to provide the well spacing dimension for reservoir connectivity in the flow chart FIG. 11.

To begin, injector-producer pairs from the multiple fluid travel time models built in block 108 of FIG. 1 are randomly selected, which is discussed in FIG. 15A. FIG. 15A is an embodiment of an exemplary reservoir model grid with injector-producer pairs. In this diagram 1600, the injector wells 1502a-1502d and producer wells 1504a-1504d are paired together to form injector-producer pairs or well pairs. The selection of the injector-producer pairs results in well pairs that have different well spacing, different locations (i.e. wells located at different locations within the model), and different orientations, which are shown by the arrows 1506a-1506d. The interconnected pore volume (IPV) is defined as the producible pore volume that connects to both of the injector and producer of the given well pair. As such, the IPV may be calculated as the overlap volume between the PPV for the injector well and the PPV for the producer well. Preferably, in this configuration, the fluid injected into the injector wells 1502a-1502d may sweep out hydrocarbons in the IPV and displace the hydrocarbons into the producer wells 1604a-1504d. Thus, IPV is related to oil or hydrocarbon recovery because it represents the maximum percentage of hydrocarbons that can be swept out between the two wells.

Figure 15B:
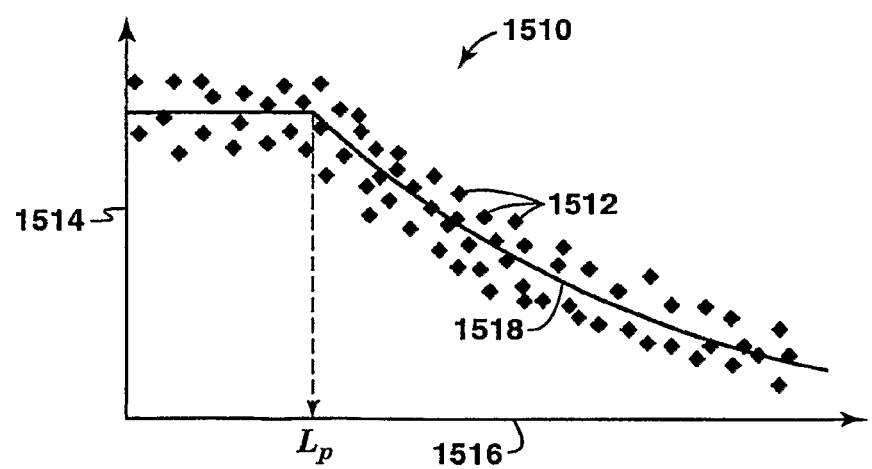

After calculating IPVs for well pairs, a plot between the IPV and well spacing may be created, as shown in FIG. 15B. In FIG. 15B, a diagram 1510 of data points 1512 that characterize the relationship between IPV and well spacing is shown against the IPV axis 1514 and a well spacing axis 1516. While the data points 1512 may be scattered, a trend curve 1518 may be fitted within the data points 1512. From this diagram 1510, various characteristics may be observed. First, IPV is about equal to PPV (producible pore volume) when well spacing is zero. Second, the IPV values along the trend curve 1518 are constant for well spacing from 0 to an interconnected pore volume plateau length (Lp), and decrease beyond the Lp. As such, the use of three parameters, such as PPV, Lp, and an Interconnected Pore Volume Decline Coefficient (IPVDC), may be beneficial to characterize the trend curve 1518. The IPVDC is the coefficient that describes the decrease of the IPV as the well spacing increased from the Lp.

Because the PPV has been previously calculated, as noted above, Lp and IPVDC are the remaining parameters that are to be calculated. The interconnected pore volume plateau length (Lp), which measures the extent of reservoir connectivity, is defined as the maximum well spacing beyond which IPV starts to decline. That is, the well spacing may be increased up to the Lp without any decline in the value of the IPV or recovery efficiency. Accordingly, the longer the Lp, the larger the connected area is for the reservoir. Lp is in a range from 0 to the maximum length of the reservoir model.

The IPVDC is defined as the measure of the decline of reservoir connectivity with well spacing. A large IPVDC indicates that the reservoir connectivity for a model deteriorates fast as well spacing increases, while a small IPVCD indicates that the reservoir connectivity is less sensitive to well spacing. The IPVDC may be defined by the following equation:

$$IPVDC = -\frac{1}{IPV}\frac{d(IPV)}{dL} \tag{6}$$

where L is well spacing. Based on this definition, IPV may be defined by the following exponential equation:

$$IPV = PPV(e^{-IPVDC(L-L_p)}) \tag{7}$$

Accordingly, the IPVDC may be estimated using Equation 7 through regression analysis.

In addition to the above global reservoir connectivity measures, which are discussed above, the present techniques also utilize the local connectivity measures. The local connectivity measures are defined as the measure of connectivity between wells. The local connectivity measures are used, for example, to investigate the connectivity for a given well pair or the connectivity of a fault.

Accordingly, three local reservoir connectivity measures, such as interwell breakthrough velocity (IBV), interwell connected volume aspect ratio (ICVAR), and interwell connected volume orientation (a), may be utilized with the present techniques to provide local reservoir connectivity measures. The IBV measures the velocity of injected fluid moving from an injector to a producer. Larger values of IBV indicate a better connection between the injector and the producer. ICVAR and α measure the shape and orientation of interwell connected volume, where α corresponds to the major swept direction between an injector and surrounding producers. Each of these three local reservoir connectivity measures is discussed further below in relation to specific equations and FIGS. 16A-16B.

IBV is defined as the distance between an injector and a producer divided by the fluid travel time from the injector to the producer. IBV is also equal to the effective hydraulic conductivity of the shortest travel time path between the two wells divided by the tortuosity of the shortest travel time path. Accordingly, the IBV may be defined by the following equation:

$$IBV = \frac{\overline{K}}{\tau} \tag{8}$$

where $\overline{K}$ is the effective hydraulic conductivity and the $\tau$ is the tortuosity of the shortest path. The effective hydraulic conductivity $\overline{K}$ is the distance ($d_l$) weighted harmonic average of hydraulic conductivities ($K_l$) along the shortest travel time path, which is defined by the following equation:

$$\overline{K} = \frac{1}{\sum_i \frac{d_i}{d_i}\frac{1}{K_i}} \tag{9}$$

$K_l$ can be calculated using Equation 2. Tortuosity can be estimated using the following equation:

$$\tau = \frac{\sum_i d_i}{D} \tag{10}$$

where D is the straight line distance between the injector and producer. From the equations, IBV is inversely proportion to tortuosity. Thus, as tortuosity increase, the interwell breakthrough velocity and reservoir connectivity decrease for a reservoir model.

An example of these parameters is shown in the embodiment of the reservoir model 1600 in FIG. 16A. In FIG. 16A, a reservoir model 1600 is shown with an injector well 1602 and a producer well 1604. The distance between the injector well 1602 and a producer well 1604 is the straight line distance D, while the shortest travel time path is along the line 1606. Further, $d_l$ is the length of connection l, while $K_l$ is the hydraulic conductivity of connection l).

The ICVAR may be calculated using the following equation:

$$ICVAR = IBV_{major}/IBV_{minor} \tag{11}$$

where $IBV_{major}$ and $IBV_{minor}$ are the lengths of the IBV ellipse in the major and minor directions, respectively. The IBV ellipse is constructed using the IBV values calculated from the injector and each of the surrounding producers.

For example, FIG. 16B is an exemplary interwell connected volume shape along with its orientation. In FIG. 16B, various producer wells 1622 are positioned around an injector well 1624. The injector well 1624 has interwell connected volume shape 1626, which has an orientation that is shown by the interwelt connected volume orientation (α). The interwell connected volume shape 1626 has a major axis $IBV_{major}$ and a minor axis $IBV_{minor}$.

Figure 17:
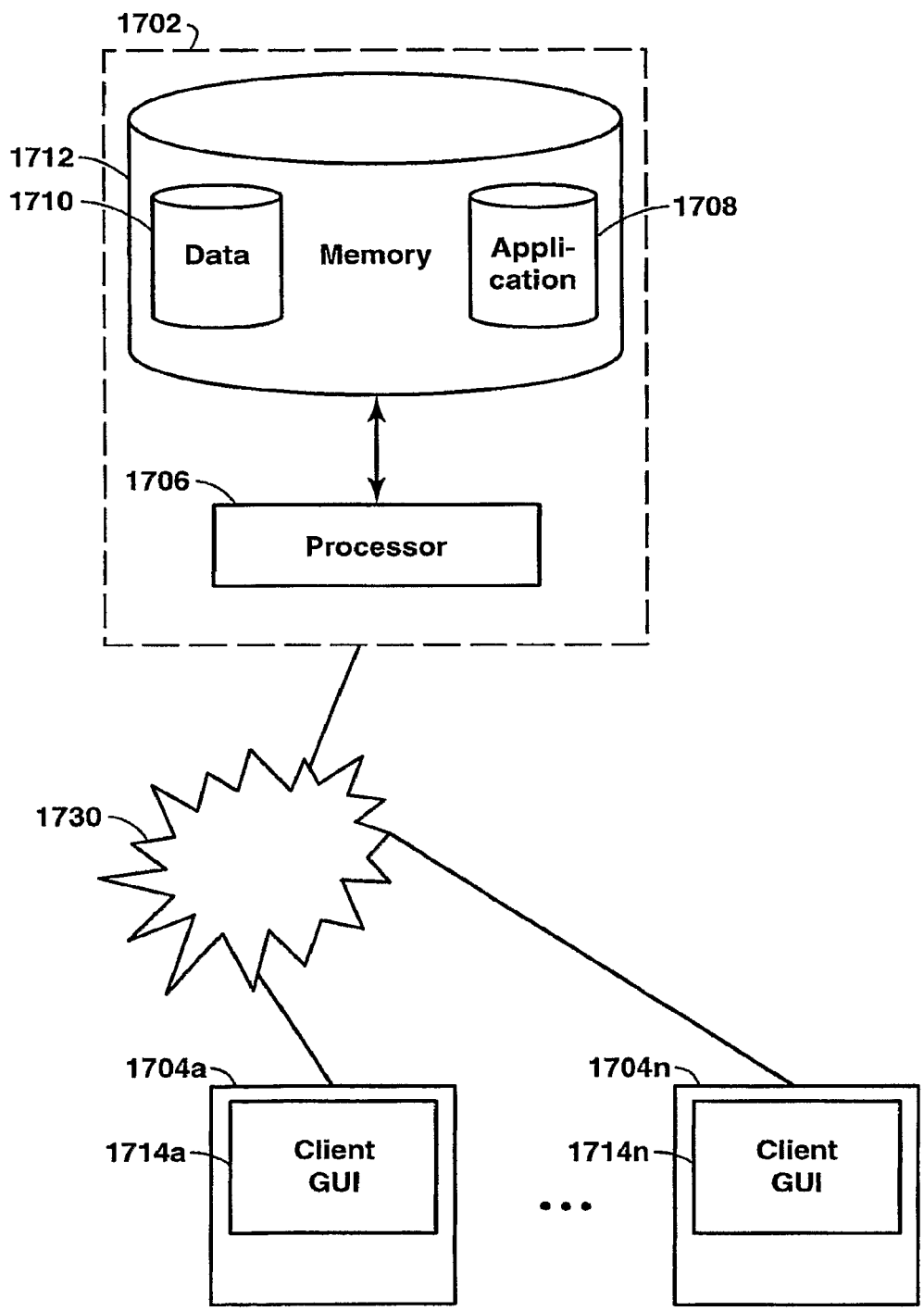
FIG. 17 is an exemplary embodiment of a modeling system that implements the present techniques.

In addition, the processes described above may be implemented in a modeling system, which is discussed below. Accordingly, different elements and components of an example modeling system are presented in FIG. 17. FIG. 17 illustrates an exemplary embodiment of a modeling system in accordance with one embodiment of the present techniques. The devices 1702 and 1704a-1704n may be computers, servers, databases and/or a combination of these types of systems, which may also include monitors, keyboards, mouses and other user interfaces for interacting with a user. The device 1702 may include a processor 1706, one or more applications 1708, data 1710 and memory 1712. The applications 1708 may include the modeling software or code configured to perform the methods described above, while the data 1710 may include seismic data, simulation data, or other information utilized in the methods described above. Of course, the memory 1712 may be any conventional type of computer readable storage used for storing applications, which may include hard disk drives, floppy disks, CD-ROMs and other optical media, magnetic tape, and the like.

Because each of the devices 1702 and 1704a-1704n may be located in different geographic locations, such as different offices, buildings, cities, or countries, a network 1730 may be utilized to provide communication paths between the devices 1702 and 1704a-1704n. The network 1730, which may include different devices (not shown), such as routers, switches, bridges, for example, may include one or more local area networks, wide area networks, server area networks, or metropolitan area networks, or combination of these different types of networks. The connectivity and use of the network 1730 by the devices 1702 and 1704a-1704n is understood by those skilled in the art.

To operate, an end user may run the simulation client graphical user interfaces (GUIs) 1714a-1714n on devices 1704a-1704n or interact directly with the device 1702. Via the GUIs 1714a-1714n or direct interaction, the applications may be launched to perform simulations of the various models discussed above on the device 302. The application 1708 may executed to by the processor 1706, which may access data 1710, such as seismic data from the memory 1712 to create reservoir models and fluid travel time models. Then, the user may analyze the fluid travel time models to calculate and analyze the reservoir connectivity measures for a specific application. Based on the reservoir connectivity measures, wells may be drilling, completed and produced.

Further, it should be noted that in FIG. 1, the graph theory method and the front propagation method are complementary. In general, the graph theory method may be utilized to handle directional flows between two nodes (e.g., uphill or downhill flows with the gravity effect) using directed connections, while the front propagation method may lack the ability to handle directional flows between two nodes. In addition, the graph theory method is less computationally expensive than the front propagation method. However, the front propagation method has smaller orientation errors than the graph theory method. As such, the various factors along with user experience and personal judgment may be utilized to select a specific method for a given situation.

While the present techniques of the invention may be susceptible to various modifications and alternative forms, the exemplary embodiments discussed above have been shown only by way of example. However, it should again be understood that the invention is not intended to be limited to the particular embodiments disclosed herein. Indeed, the present techniques of the invention include all alternatives, modifications, and equivalents falling within the true spirit and scope of the invention as defined by the following appended claims.

What is claimed is:

1. A method for producing hydrocarbons comprising:
    constructing a plurality of fluid travel time models from a reservoir model;
    calculating reservoir connectivity measures from the plurality of fluid travel time models;
    analyzing the reservoir connectivity measures to determine a location for at least one well;
    drilling the at least one well based on the analysis; and
    producing hydrocarbons from the drilled at least one well.

2. The method of claim 1 wherein constructing the plurality of fluid travel time models comprises creating the plurality of fluid travel time models via a graph theory method.

3. The method of claim 1 wherein constructing the plurality of fluid travel time models comprises:
    nondimensionalizing the reservoir model; selecting a flow network model;
    assigning volume properties to a plurality of nodes in the flow network model;
    assigning flow properties to a plurality of connections in the flow network model;
    selecting at least one of the nodes to represent at least one well;
    calculate a value for each of the nodes to the selected at least one of the nodes; and assigning fluid travel times to each of the plurality of nodes.

4. The method of claim 3 wherein the flow network model comprises nodes and connections.

5. The method of claim 4 wherein the flow network model comprises an eight-neighbor model to reduce orientation errors.

6. The method of claim 3 wherein the volume properties comprise total volume, pore volume, hydrocarbon pore volume, and any combination thereof.

7. The method of claim 3 wherein the flow properties comprise permeability, porosity, fluid density, fluid viscosity, fluid travel time and any combination thereof.

8. The method of claim 1 wherein constructing the plurality of fluid travel time models comprises creating the plurality of fluid travel time models via a front propagation method.

9. The method of claim 1 wherein constructing the plurality of fluid travel time models comprises:
    nondimensionalizing the reservoir model;
    defining a plurality of nodes in a node model from the nondimensionalized reservoir model;
    assigning volume properties and travel velocities to each of the plurality of nodes;
    selecting at least one of the plurality of nodes to represent a well; and
    calculating fluid travel times for each of the plurality of nodes.

10. The method of claim 9 wherein the volume properties comprise total volume, pore volume, hydrocarbon pore volume, and any combination thereof.

11. The method of claim 1 wherein calculating the reservoir connectivity measures from the plurality of fluid travel time models comprises calculating reservoir connectivity measures for a plurality of dimensions.

12. The method of claim 11 wherein the plurality of dimensions comprise at least two of a time dimension, size dimension, orientation dimension and a space dimension.

13. The method of claim 11 wherein calculating the reservoir connectivity measures from the plurality of fluid travel time models comprises:
    calculating reservoir connectivity measures for primary depletion;
    calculating reservoir connectivity measures for secondary and tertiary recoveries; and
    calculating local connectivity measures.

14. The method of claim 13 wherein calculating the reservoir connectivity measures for primary depletion comprises: calculating producible pore volume and producible time; and calculating producible volume aspect ratio.

15. The method of claim 13 wherein calculating reservoir connectivity measures for secondary and tertiary recoveries comprises:
    calculating interconnected pore volume plateau length; and
    calculating interconnected pore volume decline coefficient.

16. The method of claim 13 wherein calculating local connectivity measures comprise:
- calculating interconnected pore volume plateau length; and
- calculating interconnected pore volume decline coefficient.

17. The method of claim 1 further comprising creating connectivity regions from the reservoir connectivity measures to determine the location for the at least one well.

18. The method of claim 1 further comprising creating connectivity maps to guide optimization of the location of the at least one well.

19. The method of claim 1 further comprising estimating fluid travel times without flow simulation to create the plurality of fluid travel time models.

20. A method for evaluating a reservoir model comprising:
- obtaining a reservoir model;
- nondimensionalizing the reservoir model;
- constructing a plurality of fluid travel time models from the nondimensionalized reservoir model;
- calculating reservoir connectivity measures from the plurality of fluid travel time models; and
- analyzing the reservoir connectivity measures to determine the location of at least one well for a reservoir.

21. The method of claim 20 wherein constructing the plurality of fluid travel time models comprises creating the plurality of fluid travel time models via a graph theory method.

22. The method of claim 20 wherein constructing the plurality of fluid travel time models comprises:
- selecting a flow network model;
- assigning volume properties to a plurality of nodes in the flow network model;
- assigning flow properties to a plurality of connections in the flow network model;
- selecting at least one of the nodes to represent at least one well;
- calculate a value for each of the nodes to the selected at least one of the nodes; and
- assigning fluid travel times to each of the plurality of nodes.

23. The method of claim 22 wherein the volume properties comprise at least one of total volume, pore volume, hydrocarbon pore volume, and any combination thereof.

24. The method of claim 22 wherein the flow properties comprise at least one of permeability, porosity, fluid density, fluid viscosity, fluid travel time and any combination thereof.

25. The method of claim 20 wherein constructing the plurality of fluid travel time models comprises creating the plurality of fluid travel time models via a front propagation method.

26. The method of claim 20 wherein constructing the plurality of fluid travel time models comprises:
- defining a plurality of nodes in a node model from the nondimensionalized reservoir model;
- assigning volume properties and travel velocities to each of the plurality of nodes;
- selecting at least one of the plurality of nodes to represent a well; and
- calculating fluid travel times for each of the plurality of nodes.

27. The method of claim 26 wherein the volume properties comprise at least one of total volume, pore volume, hydrocarbon pore volume, and any combination thereof.

28. The method of claim 20 wherein calculating the reservoir connectivity measures from the plurality of fluid travel time models comprises calculating reservoir connectivity measures for a plurality of dimensions.

29. The method of claim 28 wherein the plurality of dimensions comprise at least two of a time dimension, size dimension, orientation dimension and a space dimension.

30. The method of claim 28 wherein calculating the reservoir connectivity measures from the plurality of fluid travel time models comprises:
- calculating reservoir connectivity measures for primary depletion;
- calculating reservoir connectivity measures for secondary and tertiary recoveries; and
- calculating local connectivity measures.

31. The method of claim 30 wherein calculating the reservoir connectivity measures for primary depletion comprises:
- calculating producible pore volume and producible time; and
- calculating producible volume aspect ratio.

32. The method of claim 30 wherein calculating reservoir connectivity measures for secondary and tertiary recoveries comprises:
- calculating interconnected pore volume plateau length; and
- calculating interconnected pore volume decline coefficient.

33. The method of claim 30 wherein calculating local connectivity measures reservoir comprise: calculating interconnected pore volume plateau length; and calculating interconnected pore volume decline coefficient.

34. The method of claim 20 further comprising creating connectivity regions from the reservoir connectivity measures to determine the location for the at least one well.

35. The method of claim 20 further comprising creating connectivity maps to guide optimization of the location of the at least one well.

36. The method of claim 20 further comprising estimating fluid travel times without flow simulation to create the plurality of fluid travel time models.

37. A system associated with the production of hydrocarbons comprising:
- a processor;
- memory coupled to the processor;
- an application stored in the memory and configured to:
  - construct a plurality of fluid travel time models from a reservoir model;
  - calculate reservoir connectivity measures from the plurality of fluid travel time models; and
- a monitor coupled to the processor and configured to present the reservoir connectivity measures.

38. The system of claim 37 wherein the application is configured to:
- nondimensionalize the reservoir model;
- select a flow network model; assign volume properties to a plurality of nodes in the flow network model;
- assign flow properties to a plurality of connections in the flow network model;
- select at least one of the nodes to represent at least one well;
- calculate a value for each of the nodes to the selected at least one of the nodes; and
- assign fluid travel times to each of the plurality of nodes.

39. The system of claim 38 wherein the volume properties comprise total volume, pore volume, hydrocarbon pore volume, and any combination thereof.

40. The system of claim 38 wherein the flow properties comprise permeability, porosity, fluid density, fluid viscosity, fluid travel time and any combination thereof.

41. The system of claim 37 wherein the application is configured to:
nondimensionalize the reservoir model;
define a plurality of nodes in a node model from the nondimensionalized reservoir model;
assign volume properties and travel velocities to each of the plurality of nodes; select at least one of the plurality of nodes to represent a well; and
calculate fluid travel times for each of the plurality of nodes.

42. The system of claim 41 wherein the volume properties comprise total volume, pore volume, hydrocarbon pore volume, and any combination thereof.

43. The system of claim 38 wherein the application is configured to calculate the reservoir connectivity measures from the plurality of fluid travel time models for a plurality of dimensions.

44. The system of claim 43 wherein the plurality of dimensions comprise at least two of a time dimension, size dimension, orientation dimension and a space dimension.

45. The system of claim 43 wherein the application is configured to: calculate reservoir connectivity measures for primary depletion; calculate reservoir connectivity measures for secondary and tertiary recoveries; and calculate local connectivity measures.

46. The system of claim 45 wherein the application is configured to: calculate producible pore volume and producible time; and calculate producible volume aspect ratio.

47. The system of claim 45 wherein the application is configured to: calculate interconnected pore volume plateau length; and calculate interconnected pore volume decline coefficient.

48. The system of claim 45 wherein the application is configured to: calculate interconnected pore volume plateau length; and calculate interconnected pore volume decline coefficient.

49. The system of claim 37 wherein the application is configured to create connectivity regions from the reservoir connectivity measures to determine the location for the at least one well.

50. The system of claim 37 wherein the application is configured to create connectivity maps to guide optimization of a location for wells.

51. The system of claim 37 wherein the application is configured to estimate fluid travel times without flow simulation that are used to create the plurality of fluid travel time models.

52. A method for evaluating a reservoir model comprising:
constructing a plurality of fluid travel time models from a reservoir model;
calculating reservoir connectivity measures from the plurality of fluid travel time models; and
analyzing the reservoir connectivity measures to determine a location for at least one well.

53. The method of claim 52 wherein constructing the plurality of fluid travel time models comprises creating the plurality of fluid travel time models via a graph theory method.

54. The method of claim 52 wherein constructing the plurality of fluid travel time models comprises:
nondimensionalizing the reservoir model;
selecting a flow network model; assigning volume properties to a plurality of nodes in the flow network model;
assigning flow properties to a plurality of connections in the flow network model;
selecting at least one of the nodes to represent at least one well;
calculate a value for each of the nodes to the selected at least one of the nodes; and
assigning fluid travel times to each of the plurality of nodes.

55. The method of claim 54 wherein the flow network model comprises nodes and connections.

56. The method of claim 54 wherein the flow network model comprises an eight-neighbor model to reduce orientation errors.

57. The method of claim 54 wherein the volume properties comprise total volume, pore volume, hydrocarbon pore volume, and any combination thereof.

58. The method of claim 54 wherein the flow properties comprise permeability, porosity, fluid density, fluid viscosity, fluid travel time and any combination thereof.

59. The method of claim 52 wherein constructing the plurality of fluid travel time models comprises creating the plurality of fluid travel time models via a front propagation method.

60. The method of claim 52 wherein constructing the plurality of fluid travel time models comprises:
nondimensionalizing the reservoir model;
defining a plurality of nodes in a node model from the nondimensionalized reservoir model;
assigning volume properties and travel velocities to each of the plurality of nodes;
selecting at least one of the plurality of nodes to represent a well; and
calculating fluid travel times for each of the plurality of nodes.

61. The method of claim 60 wherein the volume properties comprise total volume, pore volume, hydrocarbon pore volume, and any combination thereof.

62. The method of claim 52 wherein calculating the reservoir connectivity measures from the plurality of fluid travel time models comprises calculating reservoir connectivity measures for a plurality of dimensions.

63. The method of claim 62 wherein the plurality of dimensions comprise at least two of a time dimension, size dimension, orientation dimension and a space dimension.

64. The method of claim 62 wherein calculating the reservoir connectivity measures from the plurality of fluid travel time models comprises:
calculating reservoir connectivity measures for primary depletion;
calculating reservoir connectivity measures for secondary and tertiary recoveries; and
calculating local connectivity measures.

65. The method of claim 64 wherein calculating the reservoir connectivity measures for primary depletion comprises:
calculating producible pore volume and producible time; and
calculating producible volume aspect ratio.

66. The method of claim 64 wherein calculating reservoir connectivity measures for secondary and tertiary recoveries comprises:
calculating interconnected pore volume plateau length; and
calculating interconnected pore volume decline coefficient.

67. The method of claim 64 wherein calculating local connectivity measures reservoir comprise:
calculating interconnected pore volume plateau length; and
calculating interconnected pore volume decline coefficient.

68. The method of claim 52 further comprising creating connectivity regions from the reservoir connectivity measures to determine the location for the at least one well.

69. The method of claim 52 further comprising creating connectivity maps to guide optimization of the location of the at least one well.

70. The method of claim 52 further comprising estimating fluid travel times without flow simulation to create the plurality of fluid travel time models.

* * * * *